(12) United States Patent  
Imamura et al.

(10) Patent No.: US 8,551,857 B2  
(45) Date of Patent: Oct. 8, 2013

(54) SEMICONDUCTOR DEVICE AND METHOD FOR MANUFACTURING THE SAME

(75) Inventors: Yuji Imamura, Ome (JP); Tsuyoshi Fujiwara, Ome (JP); Toyohiko Kuno, Tokyo (JP)

(73) Assignees: Hitachi, Ltd., Tokyo (JP); Asahi Kasei Microdevices Corporation, Tokyo (JP)

( * ) Notice: Subject to any disclaimer, the term of this patent is extended or adjusted under 35 U.S.C. 154(b) by 252 days.

(21) Appl. No.: 13/034,749

(22) Filed: Feb. 25, 2011

(65) Prior Publication Data

US 2011/0210422 A1    Sep. 1, 2011

(30) Foreign Application Priority Data

Feb. 26, 2010    (JP) ................................. 2010-043192

(51) Int. Cl.
*H01L 29/92*    (2006.01)

(52) U.S. Cl.
USPC ................. 438/397; 257/532; 257/E21.008; 257/E29.343; 438/396

(58) Field of Classification Search
USPC .......... 257/532, E21.008, E29.342, E29.343; 438/396, 397
See application file for complete search history.

(56) References Cited

U.S. PATENT DOCUMENTS

| | | | |
|---|---|---|---|
| 6,596,581 B2 * | 7/2003 | Park et al. | 438/253 |
| 6,646,323 B2 * | 11/2003 | Dirnecker et al. | 257/532 |
| 6,649,464 B2 * | 11/2003 | Lee | 438/238 |
| 7,288,807 B1 | 10/2007 | Akamatsu | |
| 7,582,901 B2 * | 9/2009 | Takeda et al. | 257/68 |
| 2002/0179955 A1 | 12/2002 | Morimoto et al. | |
| 2003/0027386 A1 * | 2/2003 | Lee | 438/253 |
| 2005/0212082 A1 * | 9/2005 | Takeda et al. | 257/534 |
| 2007/0164434 A1 * | 7/2007 | Watanabe | 257/758 |
| 2008/0203531 A1 | 8/2008 | Imai et al. | |
| 2010/0133655 A1 * | 6/2010 | Nakanishi | 257/532 |
| 2011/0284991 A1 * | 11/2011 | Hijioka et al. | 257/532 |

FOREIGN PATENT DOCUMENTS

| | | |
|---|---|---|
| JP | 2003-051501 A | 2/2003 |
| JP | 2005-142435 A | 6/2005 |
| JP | 2007-201062 A | 8/2007 |
| JP | 2008-210996 A | 9/2008 |

OTHER PUBLICATIONS

J.S. Dunn et al. "Foundation of rf CMOS and SiGe BICMOS Technologies" IBM Journal Research and Development vol. 47 No. 23 Mar./May 2/3, 2003, pp. 101 to 135.

* cited by examiner

*Primary Examiner* — Allan R Wilson
(74) *Attorney, Agent, or Firm* — Miles & Stockbridge P.C.

(57) ABSTRACT

The technique for manufacturing a high-capacitance and high-accuracy MIM electrostatic capacitor by a small number of steps is provided. After a lower electrode of the electrostatic capacitor and second wiring are formed at the same time on a first interlayer insulating film, an opening part is formed in a second interlayer insulating film deposited on the first interlayer insulating film. Next, a capacitance insulating film, a second metal film and a protective metal film are sequentially deposited on the second interlayer insulating film including the interior of the opening part, and the protective metal film, the second metal film and the capacitance insulating film on the second interlayer insulating film are polished and removed by a CMP method, thereby causing the capacitance insulating film, an upper electrode made of the second metal film and the protective metal film to remain in the opening part.

7 Claims, 22 Drawing Sheets

US 8,551,857 B2

SEMICONDUCTOR DEVICE AND METHOD FOR MANUFACTURING THE SAME

CROSS-REFERENCE TO RELATED APPLICATION

The present application claims priority from Japanese Patent Application No. 2010-043192 filed on Feb. 26, 2010, the content of which is hereby incorporated by reference to this application.

TECHNICAL FIELD OF THE INVENTION

The present invention relates to a semiconductor device and a technique for manufacturing the same, and more particularly to a technique effectively applied to a semiconductor device having an electrostatic capacitor with a MIM (Metal Insulator Metal) structure in an integrated circuit and to the manufacture of the same.

BACKGROUND OF THE INVENTION

In recent years, an electrostatic capacitor having a high capacitance, high accuracy and a low leakage current has been required in various filter circuits and analog-digital converter circuits incorporated in analog-digital LSI (Large Scale Integrated circuit), transmitting/receiving circuits incorporated in RF (Radio Frequency) transmitting/receiving LSI, and others. Also, increase in the integration of the electrostatic capacitor has also been required for reducing the cost of LSI.

As an electrostatic capacitor of this type, an electrostatic capacitor with a so-called MIM structure in which a capacitance insulating film is disposed between a pair of electrodes (a lower electrode and an upper electrode) made of metal films formed on a semiconductor substrate is known.

For example, IBM Journal Research and Development Vol. 47 No. 23 2/3 Mar./May 2003, pp. 101 to 135 (Non-Patent Document 1) describes a technique in which, after a metal film for a lower electrode, a capacitance insulating film and a metal film for an upper electrode are sequentially deposited on a semiconductor substrate, these films are patterned by the dry etching using a photoresist film as a mask, thereby forming an electrostatic capacitor with a parallel-plate MIM structure.

Japanese Patent Application Laid-Open Publication No. 2008-210996 (Patent Document 1) and Japanese Patent Application Laid-Open Publication No. 2005-142435 (Patent Document 2) describe a manufacturing technique of an electrostatic capacitor in which an opening part is provided in an interlayer insulating film on a lower electrode formed on a semiconductor substrate, and a capacitance insulating film and an upper electrode are formed in this opening part.

The method for manufacturing the electrostatic capacitor described in the Patent Document 1 includes: a step of forming a first metal film (for example, an aluminum alloy film) on a first interlayer insulating film of a semiconductor substrate; a step of forming a first upper-layer barrier film (for example, a stacked film of a titanium film and a titanium nitride film) on the first metal film; a step of processing the first metal film and the stacked film of the first upper-layer barrier film, thereby forming first metal wiring and a lower electrode of the electrostatic capacitor at the same time; a step of forming a second interlayer insulating film covering the first metal wiring and the lower electrode; a step of partially removing the second interlayer insulating film, thereby exposing a part of an upper surface of the first upper-layer barrier film constituting a part of the lower electrode; a step of forming a capacitance insulating film (for example, a silicon nitride film) of the electrostatic capacitor on the exposed first barrier film of the lower electrode; a step of forming a second metal film (for example, an aluminum alloy film) on the second interlayer insulating film and the electrostatic capacitance insulating film; a step of forming a second upper-layer barrier film (for example, a stacked film of a titanium film and a titanium nitride film) on the second metal film; and a step of processing the second metal film and the stacked film of the second upper-layer barrier film, thereby forming second metal wiring and an upper electrode of the electrostatic capacitor at the same time.

The method for manufacturing the electrostatic capacitor described in the Patent Document 2 includes: a step of forming a first electrode (a lower electrode) of the electrostatic capacitor made of a first-layer metal film (for example, a stacked film of a TiN film, an AlCu film and a TiN film) on a surface of an insulating film on a semiconductor substrate; a step of forming a first interlayer insulating film on the first electrode; a step of etching a part of the first interlayer insulating film, thereby forming an opening part from which the surface of the first electrode is exposed; a step of depositing a dielectric film (for example, a silicon nitride film) and a second-layer metal film (for example, a stacked film of an AlCu film and a TiN film) on the first interlayer insulating film including the interior of the opening part; and a step of polishing the second-layer metal film and the dielectric film by a chemical mechanical polishing (CMP) method, thereby forming a dielectric film and a second electrode (an upper electrode) of the electrostatic capacitor in the opening part.

Japanese Patent Application Laid-Open Publication No. 2007-201062 (Patent Document 3) relates to a method for forming an electrostatic capacitor with a MIS (Metal Insulator Silicide) structure and discloses a method in which, after a lower electrode of the electrostatic capacitor made of a metal silicide film (for example, Ni silicide) is formed on a semiconductor substrate, a capacitance insulating film made of, for example, a nitride film and an upper electrode made of a metal film (for example, a Ni film) are formed in a recess part (a recess part whose periphery is surrounded by an oxide film) on the lower electrode.

The above-described electrostatic capacitor is formed at the same time in the step of forming a gate electrode of an N-type MIS transistor having the stacked structure of the metal silicide film, the capacitance insulating film and the metal film. The capacitance insulating film and the upper electrode of the electrostatic capacitor are formed by polishing the capacitance insulating film and the metal film, which are deposited on the oxide film including the interior of the recess part on the lower electrode, by a CMP method, thereby causing the capacitance insulating film and the metal film to remain in the opening part.

SUMMARY OF THE INVENTION

FIG. 29 shows the technique disclosed in the Non-Patent Document 1 described above, which corresponds to an electrostatic capacitor structure (parallel-plate MIM capacitor) formed by sequentially stacking a capacitance insulating film and a metal film for an upper electrode on a lower electrode. The inventors of the present invention formed the device structure shown in FIG. 29 by applying the manufacturing method shown in FIGS. 30A to 30D and then carried out the examination for the structure.

First, as shown in FIG. 30A, an insulating film 51 such as a silicon oxide film is deposited on a semiconductor substrate 50, and then a first metal film 52a for the lower electrode, the capacitance insulating film 53 and a second metal film 54a for the upper electrode are sequentially deposited on the insulating film 51.

Next, as shown in FIG. 30B, the second metal film 54a is patterned by the dry etching using a photoresist film 100 as a mask, thereby forming an upper electrode 54. In this step, it is necessary to prevent the first metal film 52a for the lower electrode from being etched in the etching for patterning the second metal film 54a. Therefore, the progress of the etching has to be stopped on the capacitance insulating film 53. Herein, the reduction of the film thickness of the capacitance insulating film 53 is an effective method for forming a high-capacitance capacitor, but the above-described dry etching becomes more difficult as the capacitance insulating film 53 becomes thinner. This point is one of the problems included in the Non-Patent Document 1.

Next, as shown in FIG. 30C, the capacitance insulating film 53 and the first metal film 52a are patterned by the dry etching using a photoresist film 101 as a mask, thereby forming the lower electrode 52 and first-layer wirings 56 and 57. Through the steps described above, an electrostatic capacitor 55 made up of the lower electrode 52, the capacitance insulating film 53 and the upper electrode 54 is completed.

Generally, the manufacturing cost of LSI can be reduced as the number of wiring layers becomes smaller, and therefore, it is necessary to reduce the number of wiring layers as much as possible. Moreover, the increase of the integration degree of each wiring is also effective for the cost reduction of LSI. According to such points, it is desirable to form the lower electrode 52 at the same time as general wiring (first-layer wiring 56 and 57) such as power wiring and signal wiring. Moreover, the general wiring is also required to have a high integration degree. The reduction of the width and interval of the wirings, that is, the so-called microfabrication technique is required as a method for increasing the integration of the wiring. In order to carry out the microfabrication, the reduction of the thickness of a photoresist film is required due to the physical restrictions of photolithography technique. Therefore, the photoresist film 101 for performing the patterning of the first metal film 52a has to completely cover the upper electrode 54 and surely has a sufficient film thickness in consideration of the etching resistance capable of preventing the upper electrode 54 from being exposed during the etching. In this respect, there is a problem that the establishment of a manufacturing method is difficult.

Next, as shown in FIG. 30D, contact holes 60, 61 and 62 are formed in an interlayer insulating film 58 covering the upper electrode 54, the lower electrode 52 and the first-layer wiring 57 so as to expose the surfaces of the upper electrode 54, the lower electrode 52 and the first-layer wiring 57, and then, metal plugs 63 are buried in the contact holes 60, 61 and 62. Thereafter, second-layer wirings 64, 65 and 66 are formed on the interlayer insulating film 58, thereby completing the structure shown in FIG. 29.

In the above-described parallel-plate electrostatic capacitor structure, since only the distance corresponding to the film thickness of the capacitance insulating film 53 is ensured as the physical distance between the upper electrode 54 and the lower electrode 52, an electric field is concentrated at an electrode end part, and the intensity of the electric field is increased. However, the increase in the electric field intensity in an electrostatic capacitor causes the increase in a leakage current and serves as a factor for the reduction of the breakdown voltage characteristics. Therefore, it is difficult in this structure to achieve a highly stable high-capacitance electrostatic capacitor obtained by the reduction of the thickness of the capacitance insulating film.

FIG. 31 shows the electrostatic capacitor structure (trench MIM capacitor) of the Patent Document 1 in which an opening part is provided in an interlayer insulating film on a lower electrode, and a capacitance insulating film and an upper electrode are formed in the opening part. The inventors of the present invention formed the structure of FIG. 31 by applying the manufacturing method shown in FIGS. 32A to 32D and FIGS. 33A to 33C and then carried out the examination.

First, as shown in FIG. 32A, a first metal film 71a for a lower electrode is deposited on a first interlayer insulating film 70 deposited on a semiconductor substrate 50, and then, as shown in FIG. 32B, the first metal film 71a is patterned by the dry etching using a photoresist film 103 as a mask, thereby forming the lower electrode 71 and lower-layer wirings 72, 73 and 74.

Herein, the lower electrode 71 and the lower-layer wirings 72, 73 and 74 are formed at the same time, but since it is unnecessary to change the processes from those of the case where only the lower-layer wirings 72, 73 and 74 are formed, the processability of the lower electrode 71 is not lowered unlike the case of forming the above-described parallel-plate electrostatic capacitor.

Next, as shown in FIG. 32C, a second interlayer insulating film 75 covering the lower electrode 71 and the lower-layer wirings 72, 73 and 74 are deposited. Herein, the second interlayer insulating film 75 needs to be deposited so as to have the film thickness by which the lower electrode 71 and the lower-layer wirings 72, 73 and 74 can be completely covered.

Next, as shown in FIG. 32D, the opening part 76 is formed in the second interlayer insulating film 75 by the dry etching using a photoresist film 104 as a mask, thereby exposing a part of the upper surface of the lower electrode 71.

Next, as shown in FIG. 33A, a capacitance insulating film 77 and a second metal film 78a for an upper electrode are sequentially stacked on the second interlayer insulating film 75 including the interior of the opening part 76. Then, as shown in FIG. 33B, the second metal film 78a and the capacitance insulating film 77 are patterned by the dry etching using a photoresist film 105 as a mask, thereby forming an upper electrode 78 and a capacitance insulating film 77 covering the opening part 76. Through the steps described above, the electrostatic capacitor 79 made up of the lower electrode 71, the capacitance insulating film 77 and the upper electrode 78 is completed.

Herein, since the second metal film 78a and the capacitance insulating film 77 are patterned by using photolithography technique, the diameter of the photoresist film 105 has to be larger than the diameter of the opening part 76 in consideration of misalignment of the photoresist film 105 and the opening part 76. Therefore, the end parts of the capacitance insulating film 77 and the upper electrode 78 formed in the opening part 76 are positioned outside the opening part 76 (on the second interlayer insulating film 75).

Next, as shown in FIG. 33C, contact holes 80 and 81 are formed in the second interlayer insulating film 75 so as to expose the surfaces of the lower electrode 71 and the lower-layer wiring 74, and then, metal plugs 82 are buried in the contact holes 80 and 81. Thereafter, second-layer wirings 83, 84 and 85 are formed on the interlayer insulating film 75, thereby completing the structure shown in FIG. 31.

In the above-described method for manufacturing the trench electrostatic capacitor, the interlayer insulating film 75 below the upper electrode 78 that is positioned outside the opening part 76 (on the second interlayer insulating film 75) functions as a capacitance insulating film, and a parasitic capacitance is generated between the upper electrode 78 on the second interlayer insulating film 75 and the lower electrode 71 below that. Since the parasitic capacitance can be considered as a capacitance parallelly connected to the electrostatic capacitor 79, particularly in a fine electrostatic capacitor 79, that is, the electrostatic capacitor 79 in which the area of the opening part 76 is small, the electrostatic capacitance (capacitance density) per unit area appears to be large. Moreover, since the parasitic capacitance like this is varied in accordance with manufacturing variations in photolithography process, error accuracy cannot be estimated, and it is difficult to form the fine electrostatic capacitor 79 at high accuracy.

The Patent Document 2 describes a technique in which, after the above-described step shown in FIG. 33A, the second metal film 78a and the capacitance insulating film 77 on the second interlayer insulating film 75 are polished and removed by using a chemical mechanical polishing method, thereby forming the capacitance insulating film 77 and the upper electrode 78 in the opening part 76. However, in the case of this technique, if the flatness of the second interlayer insulating film 75 is insufficient or if the opening parts 76 having different sizes are present in the second interlayer insulating film 75, there are problems that the second metal film 78a remains on the second interlayer insulating film 75 and that the upper electrode 78 (second metal film 78a) in the opening part 76 is polished more than necessary.

In the electrostatic capacitor with the MIS structure disclosed in the Patent Document 3, a metal silicide film is used as the material of a lower electrode. However, since the metal silicide film is formed by reacting a polycrystalline silicon film with a metal film formed thereon, there is a problem that variations in the capacitance density are increased due to, for example, irregularities on the surface of the polycrystalline silicon film.

Japanese Patent Application Laid-Open Publication No. 2003-051501 (Patent Document 4) discloses the formation of a MIM capacitor in a multilayer interconnection structure by using the dual damascene process. However, since a metal film to be an upper electrode is directly electrically connected to upper-layer wiring in this structure, a parasitic capacitance is generated between the upper-layer wiring and a lower electrode (for example, FIG. 12 of Patent Document 4), and there is a problem that the accuracy of the electrostatic capacitor is lowered as is described in relation to FIG. 31.

An object of the present invention is to provide a technique for manufacturing a high-capacitance and high-accuracy MIM electrostatic capacitor by a small number of steps.

Another object of the present invention is to provide a technique for promoting miniaturization of a high-capacitance and high-accuracy MIM electrostatic capacitor.

The above and other objects and novel characteristics of the present invention will be apparent from the description of the present specification and the accompanying drawings.

The following is a brief description of an outline of the typical invention disclosed in the present application.

A method for manufacturing a semiconductor device which is one preferred aspect of the present invention is a method for manufacturing a semiconductor device having an electrostatic capacitor with a MIM structure including a lower electrode, a capacitance insulating film and an upper electrode formed on a semiconductor substrate, and a step of forming the electrostatic capacitor includes: (a) a step of patterning a first metal film formed on a first interlayer insulating film on the semiconductor substrate, thereby forming the lower electrode; (b) a step of forming a second interlayer insulating film on the first interlayer insulating film and the lower electrode; (c) a step of forming an opening part in a part of the second interlayer insulating film, thereby causing a surface of the lower electrode to be exposed from a bottom surface of the opening part; (d) a step of forming the capacitance insulating film so as to cover an upper part of the second interlayer insulating film and a side wall and the bottom surface of the opening part; (e) a step of sequentially forming a second metal film and a protective metal film on the capacitance insulating film, thereby filling the opening part with the protective metal film; (f) a step of polishing and removing the protective metal film, the second metal film and the capacitance insulating film on the second interlayer insulating film by a chemical mechanical polishing method, thereby causing the capacitance insulating film, the upper electrode made of the second metal film and the protective metal film to remain in the opening part; and (g) a step of forming a third interlayer insulating film on the second interlayer insulating film.

The effects obtained by typical embodiments of the invention disclosed in the present application will be briefly described below.

According to the method for manufacturing the semiconductor device which is a preferred aspect of the present invention, a high-capacitance and high-accuracy MIM electrostatic capacitor can be manufactured by a small number of steps.

According to the method for manufacturing the semiconductor device which is a preferred aspect of the present invention, miniaturization of the high-capacitance and high-accuracy MIM electrostatic capacitor can be promoted.

BRIEF DESCRIPTIONS OF THE DRAWINGS

DESCRIPTIONS OF THE PREFERRED EMBODIMENTS

Figure 1:
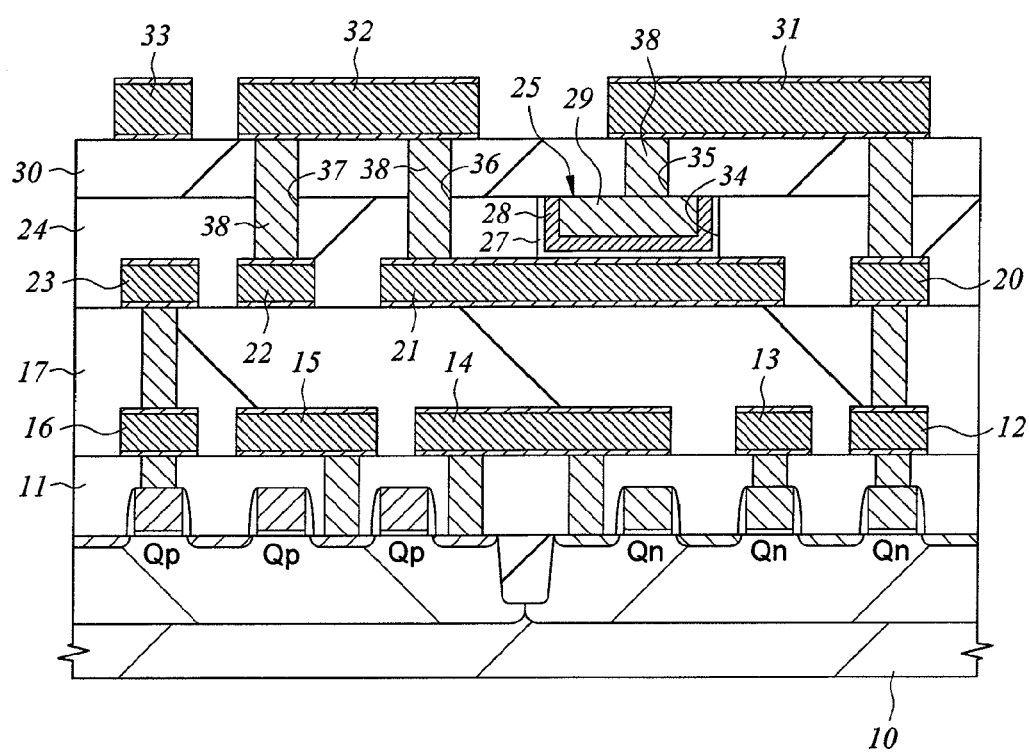
FIG. 1 is a cross-sectional view showing a semiconductor device of a first embodiment of the present invention.

Hereinafter, embodiments of the present invention will be described in detail with reference to the accompanying drawings. Note that components having the same function are denoted by the same reference symbols throughout the drawings for describing the embodiments, and the repetitive description thereof will be omitted. In addition, the description of the same or similar portions is not repeated in principle unless particularly required in the following embodiments. Also, in the drawings for describing the embodiments, hatching is used even in a plan view so as to make the structure easily understood.

First Embodiment

FIG. 1 is a cross-sectional view showing a main part of a semiconductor device of the present embodiment. As shown in FIG. 1, n channel MISFETs (Metal Insulator Semiconductor Field Effective Transistors) Qn and p channel MISFETs Qp are formed on a semiconductor substrate 10 made of single crystal silicon, and first-layer wirings 12, 13, 14, 15 and 16 are formed above the n channel MISFETs Qn and the p channel MISFETs Qp via an insulating film 11. Moreover, second-layer wirings 20, 22 and 23 and a lower electrode 21 are formed above the first-layer wirings 12 to 16 via a first interlayer insulating film 17.

A second interlayer insulating film 24 is formed on the second-layer wirings 20, 22 and 23 and the lower electrode 21, and an opening part 34 on a bottom surface of which the lower electrode 21 is exposed is formed in the second interlayer insulating film 24 on the lower electrode 21. Moreover, in the opening part 34, a capacitance insulating film 27, an upper electrode 28 and a protective metal film 29 are buried in this order from the lower layer thereof.

The lower electrode 21 formed in the layer below the opening part 34, the capacitance insulating film 27, the upper electrode 28 and the protective metal film 29 formed in the opening part 34 constitute an electrostatic capacitor 25 with a MIM structure.

A third interlayer insulating film 30 is formed on the second interlayer insulating film 24 and the opening part 34, and a contact hole 35 is formed in the third interlayer insulating film 30 on the protective metal film 29 buried in the opening part 34. The protective metal film 29 is connected to third-layer wiring 31 on the third interlayer insulating film 30 via a metal plug 38 formed in the contact hole 35.

Moreover, third-layer wirings 32 and 33 are formed together with the third-layer wiring 31 on the third interlayer insulating film 30. Since the upper electrode 28 and the protective metal film of the electrostatic capacitor 25 are separated from the third-layer wiring 31 by the second interlayer insulating film 24, no problem is caused even when the wiring (third-layer wirings 32 and 33) other than the third-layer wiring 31 is disposed above the electrostatic capacitor 25.

Two contact holes 36 and 37 are formed in the third interlayer insulating film 30 and the second interlayer insulating film 24 which are the layers below the third-layer wiring 32. The third-layer wiring 32 is connected to the lower electrode 21 of the electrostatic capacitor 25 via the metal plug 38 in the contact hole 36, and is connected to the second-layer wiring via the metal plug 38 in the contact hole 37.

In the following drawings, the illustration of the region below the first interlayer insulating film 17 is omitted, and only the first interlayer insulating film 17 and the region above the first interlayer insulating film 17 are shown.

Figure 2:
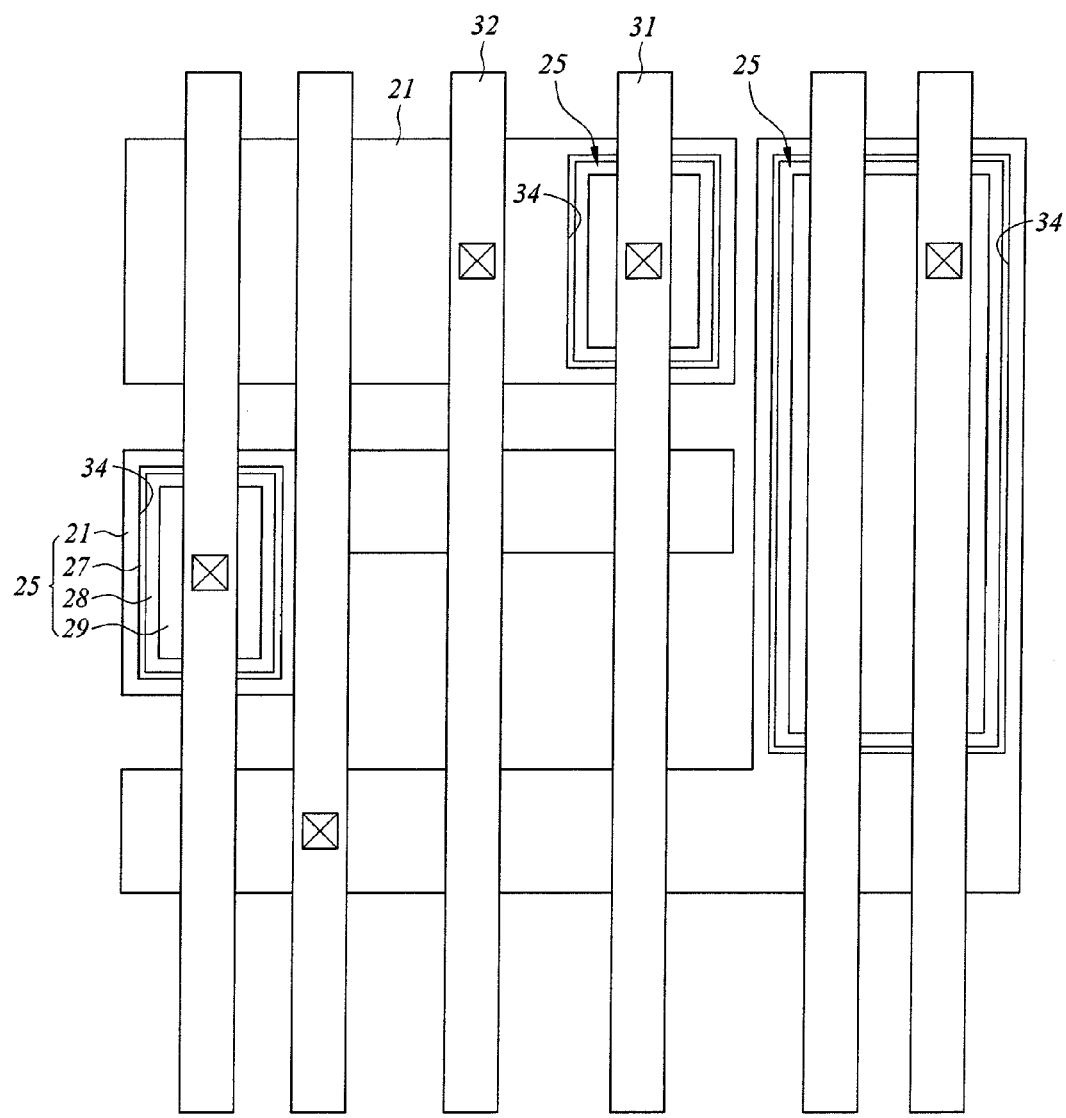
FIG. 2 is a plan view showing a main part of the semiconductor device of the first embodiment of the present invention.
Figure 3:
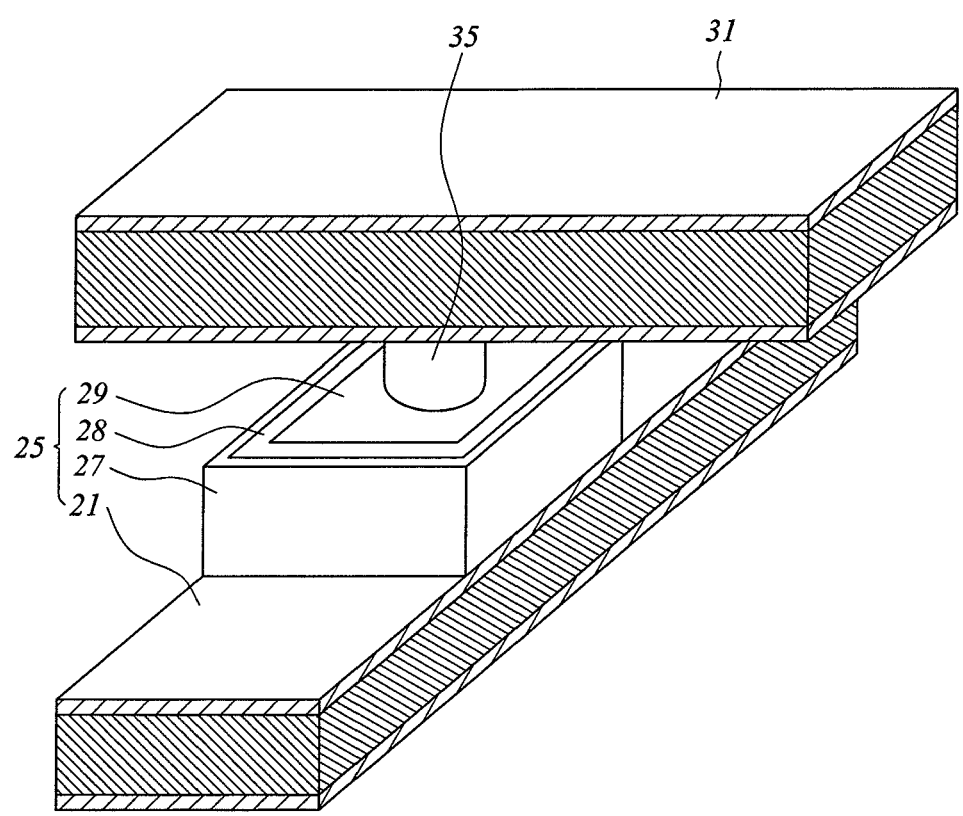
FIG. 3 is a perspective view showing a main part of the semiconductor device of the first embodiment of the present invention.
Figure 4:
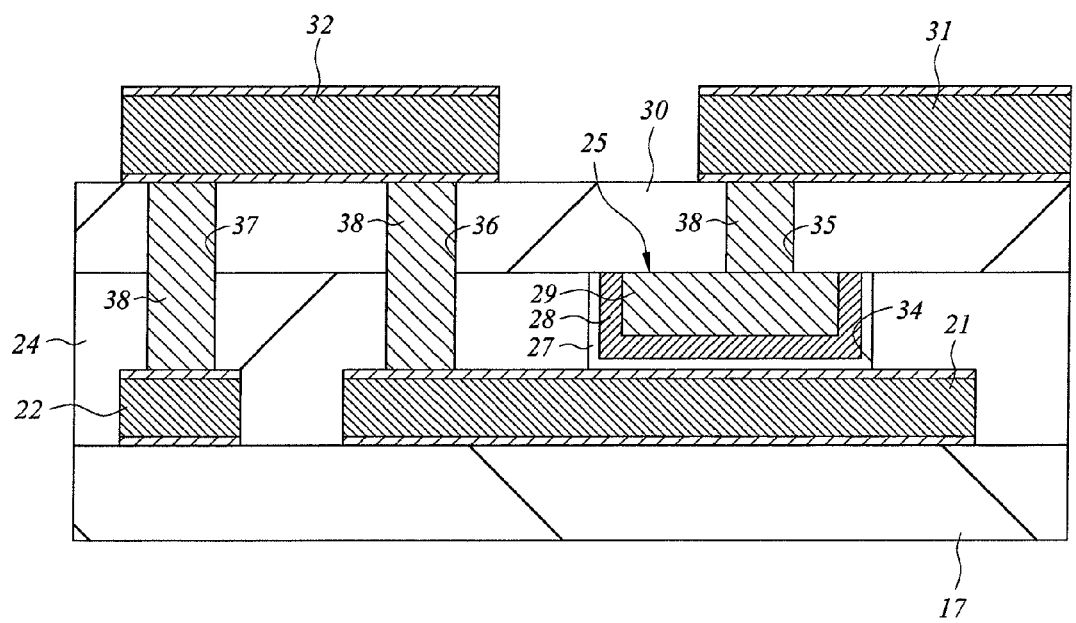
FIG. 4 is a cross-sectional view showing a main part of the semiconductor device of the first embodiment of the present invention.

FIG. 2 is a plan view showing the second-layer wiring 21, the electrostatic capacitor 25 and the third-layer wirings 31 and 32 viewed from above. FIG. 2 shows three electrostatic capacitors 25 each having the same structure as the above-described electrostatic capacitor 25, and FIG. 1 shows the region in which one of these is formed. The planar shape of the opening part 34 in which the electrostatic capacitor 25 is formed can be arbitrarily changed to a square, a rectangle or the like in accordance with the layout of the second-layer wirings 20 to 23. FIG. 3 is a perspective view showing the second-layer wiring 21, the electrostatic capacitor 25, the contact hole 35 and the third-layer wiring 31 viewed from above, and FIG. 4 is a cross-sectional view showing a part of FIG. 1 in an enlarged manner.

Next, a method for manufacturing the semiconductor device having the electrostatic capacitor 25 will be described in the order of steps with reference to FIG. 5 to FIG. 16. Note that, since the process from the step of forming the n channel MISFETs Qn and the p channel MISFETs Qp shown in FIG. 1 to the step of forming the first-layer wirings 12 to 16 can be carried out in accordance with an ordinary method, the descriptions thereof are omitted.

Figure 5:
FIG. 5 is a cross-sectional view showing a method for manufacturing the semiconductor device of the first embodiment of the present invention.

FIG. 5 shows the state in which the first interlayer insulating film 17 is deposited on the first-layer wirings 12 to 16 shown in FIG. 1. The first interlayer insulating film 17 is made of, for example, a silicon oxide film deposited by a CVD (Chemical Vapor Deposition) method.

Figure 6:
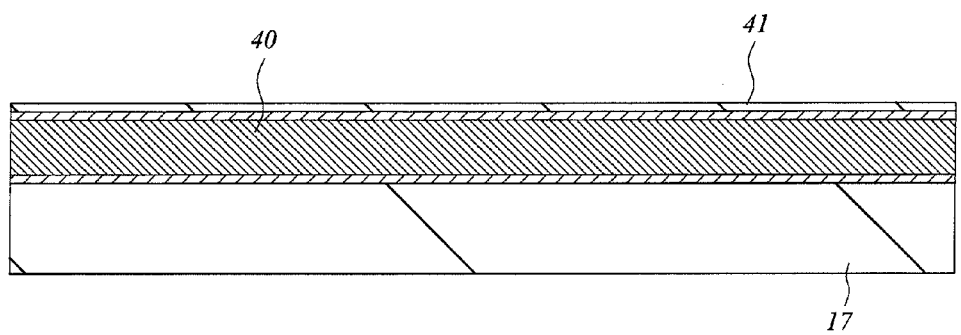
FIG. 6 is a cross-sectional view showing the method for manufacturing the semiconductor device continued from FIG. 5.

Next, as shown in FIG. 6, after a first metal film 40 is deposited on the first interlayer insulating film 17, a BARL (Bottom Anti Reflection Layer) film 41 is deposited on the first metal film 40. The first metal film 40 is made of, for example, a titanium nitride film, an aluminum alloy film and a titanium nitride film deposited by a sputtering method. The BARL film 41 is an anti-reflection film for preventing abnormal exposure of a photoresist film caused by the exposure light transmitted through the photoresist film and reflected by the surface of the first metal film 40 in the exposure of the photoresist film formed on the first metal film 40 in the next step. The BARL film 41 is made of, for example, a silicon oxynitride film deposited by a CVD method. Similar effects can be obtained also when a BARC (Bottom Anti Reflection Coat) film, a TARC (Top Anti Reflection Coat) film or the like is used instead of the BARL film 41 or together with the EARL film 41. If the above-described abnormal exposure of the photoresist film is negligible, there is no need to use these anti-reflection films.

Figure 7:
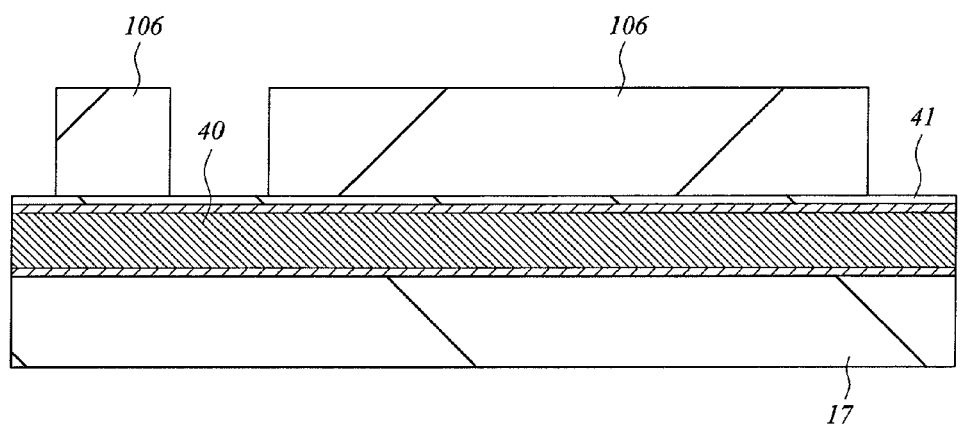
FIG. 7 is a cross-sectional view showing the method for manufacturing the semiconductor device continued from FIG. 6.
Figure 8:
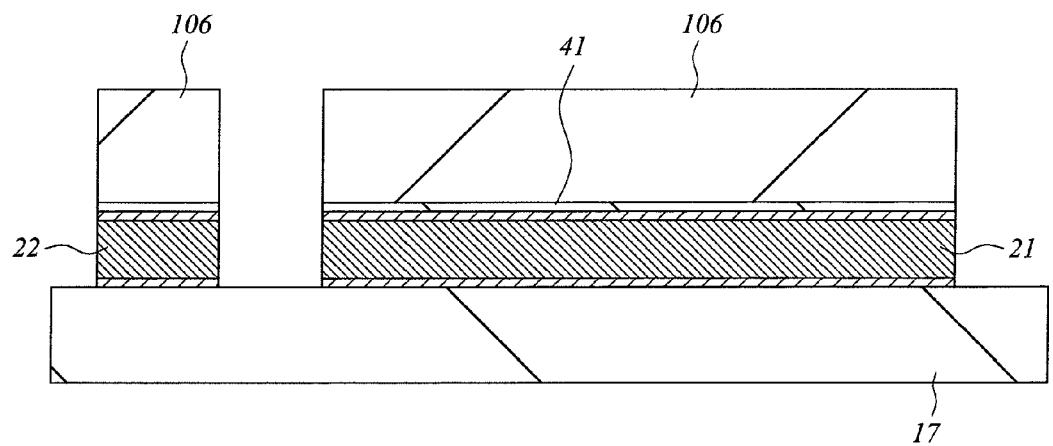
FIG. 8 is a cross-sectional view showing the method for manufacturing the semiconductor device continued from FIG. 7.

Next, as shown in FIG. 7, a photoresist film 106 applied on the EARL film 41 is subjected to exposure and development, thereby causing the photoresist film 106 to remain in a first-layer wiring forming region and a lower electrode forming region. Subsequently, as shown in FIG. 8, the EARL film 41 and the first metal film 40 are patterned by the dry etching using the photoresist film 106 as a mask, thereby forming the lower electrode 21 and the second-layer wiring 22.

Figure 9:
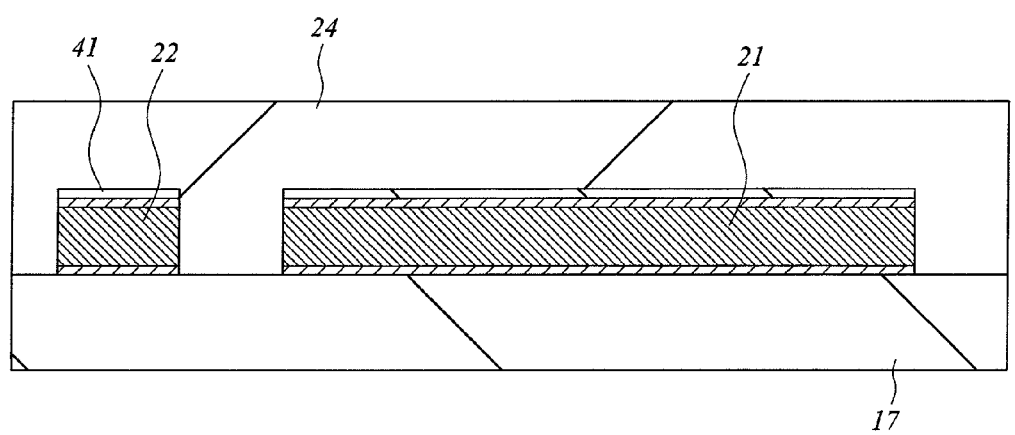
FIG. 9 is a cross-sectional view showing the method for manufacturing the semiconductor device continued from FIG. 8.

Next, after the photoresist film 106 is removed, as shown in FIG. 9, the second interlayer insulating film 24 is deposited on the lower electrode 21 and the second-layer wiring 22, and subsequently, the surface of the second interlayer insulating film 24 is planarized by using a CMP method. The second interlayer insulating film 24 is made of, for example, a silicon oxide film deposited by a CVD method.

Figure 10:
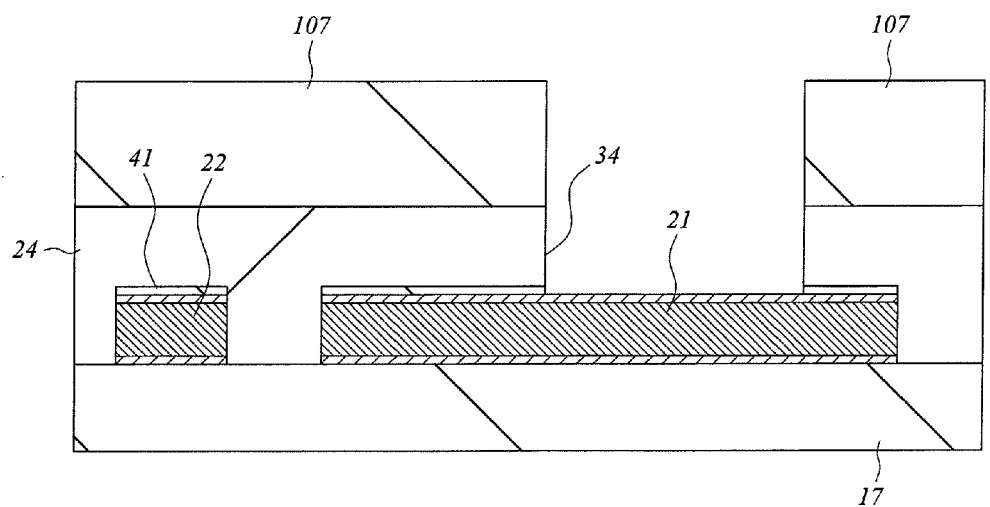
FIG. 10 is a cross-sectional view showing the method for manufacturing the semiconductor device continued from FIG. 9.

Next, as shown in FIG. 10, the second interlayer insulating film 24 and the EARL film 41 on the lower electrode 21 are subjected to dry etching with using a photoresist film 107, which is formed on the second interlayer insulating film 24, as a mask, thereby forming the opening part 34 from which the surface of the lower electrode 21 is exposed. The opening part 34 is an open-topped recess with an approximately U-shaped cross section, and the depth thereof is equal to the height from the surface of the lower electrode 21 to the flat surface of the second interlayer insulating film 24. Through the steps described above, the surface of the semiconductor substrate 10 has a flat structure having a recess only in the region in which the opening part 34 is formed.

Figure 11:
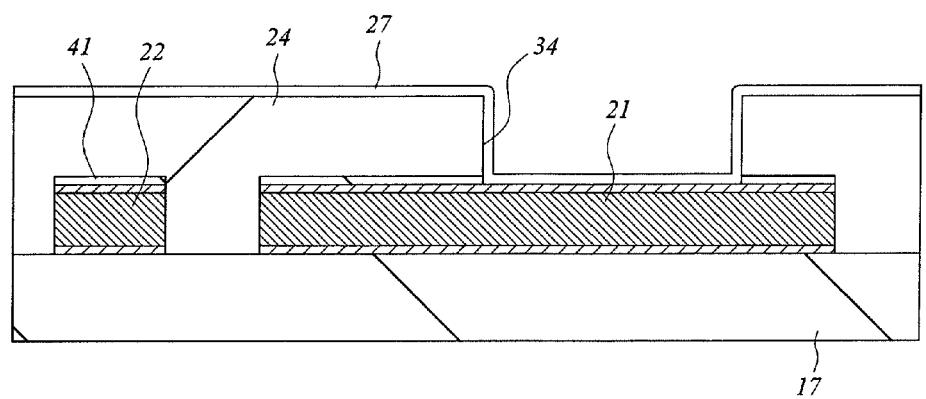
FIG. 11 is a cross-sectional view showing the method for manufacturing the semiconductor device continued from FIG. 10.

Next, after the photoresist film 107 is removed, as shown in FIG. 11, the capacitance insulating film 27 is deposited so as to cover the upper part of the second interlayer insulating film 24 and the bottom surface and the side surface of the opening part 34. The capacitance insulating film 27 is made of, for example, a silicon nitride film deposited by a CVD method. Alternatively, the capacitance insulating film 27 may be made of an insulating film having a dielectric constant higher than that of a silicon nitride film such as a tantalum oxide film or a hafnium oxide film.

Figure 12:
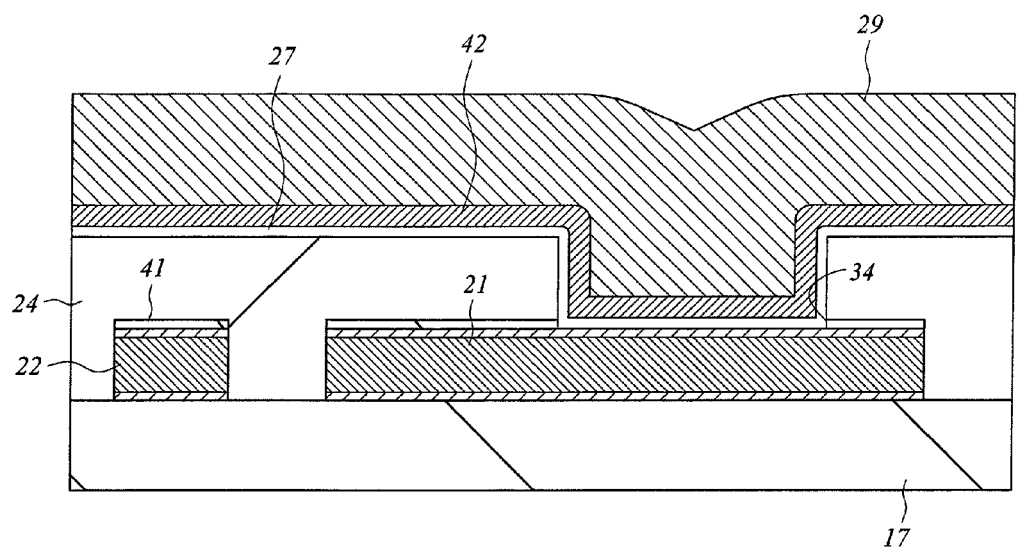
FIG. 12 is a cross-sectional view showing the method for manufacturing the semiconductor device continued from FIG. 11.

Next, as shown in FIG. 12, a second metal film 42 for the upper electrode is deposited on the capacitance insulating film 27, and subsequently, the protective metal film 29 is deposited on the second metal film 42. The second metal film 42 is made of, for example, a titanium nitride film deposited by a sputtering method, and the protective metal film 29 is made of, for example, a tungsten film deposited by a CVD method. Also, the protective metal film 29 is deposited so as to have a large film thickness by which the interior of the opening part 34 is completely filled.

A metal compound film made of tantalum nitride or a metal film made of copper, aluminum or tungsten may be used as the second metal film 42 for the upper electrode instead of the titanium nitride film, but in order to form a high-accuracy MIM capacitor, it is desirable to use a material having a resistivity equivalent to that of the lower electrode 21. Also, a metal film made of aluminum or copper or a metal compound film made of titanium nitride may be used as the protective metal film 29 instead of the tungsten film, but the material having the property that it can be polished and removed together with the second metal film 42 in the next CMP processing step is used.

Figure 13:
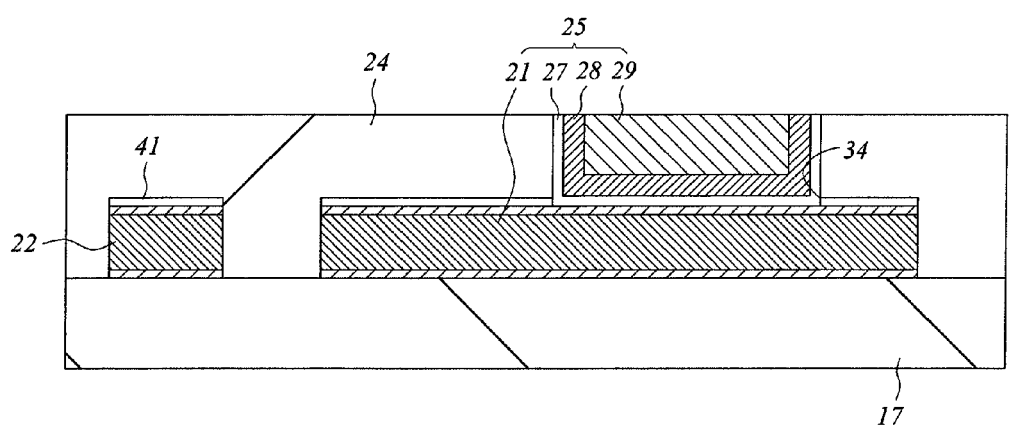
FIG. 13 is a cross-sectional view showing the method for manufacturing the semiconductor device continued from FIG. 12.

Next, as shown in FIG. 13, the protective metal film 29, the second metal film 42 and the capacitance insulating film 27 on the second interlayer insulating film 24 are polished and removed by using a CMP method, thereby causing these films to remain only in the opening part 34. At this point, the upper surfaces of the protective metal film 29, the second metal film 42 and the capacitance insulating film 27 remaining in the opening part 34 have the same height as the surface of the second interlayer insulating film 24. Through the steps described above, the electrostatic capacitor 25 with the MIM structure made up of the lower electrode 21 formed in the layer below the opening part 34 and the capacitance insulating film 27, the upper electrode 28 (second metal film 42) and the protective metal film 29 formed in the opening part 34 is completed.

Figure 14:
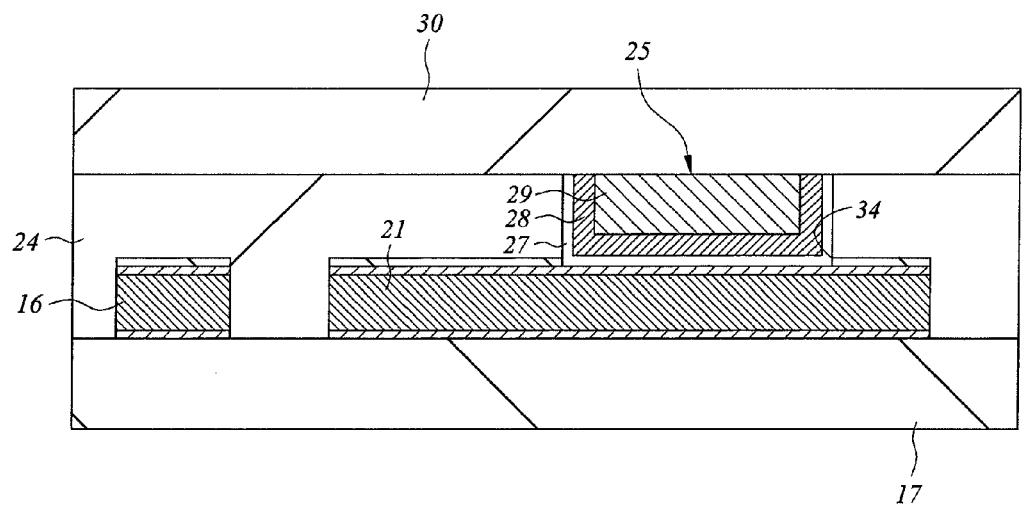
FIG. 14 is a cross-sectional view showing the method for manufacturing the semiconductor device continued from FIG. 13.

Next, as shown in FIG. 14, the third interlayer insulating film 30 is deposited on the second interlayer insulating film 24 and the electrostatic capacitor 25. The third interlayer insulating film 30 is made of, for example, a silicon oxide film deposited by a CVD method. Since the third interlayer insulating film 30 is deposited on the flat second interlayer insulating film 24, the surface thereof becomes flat even when the surface is not subjected to CMP.

Figure 15:
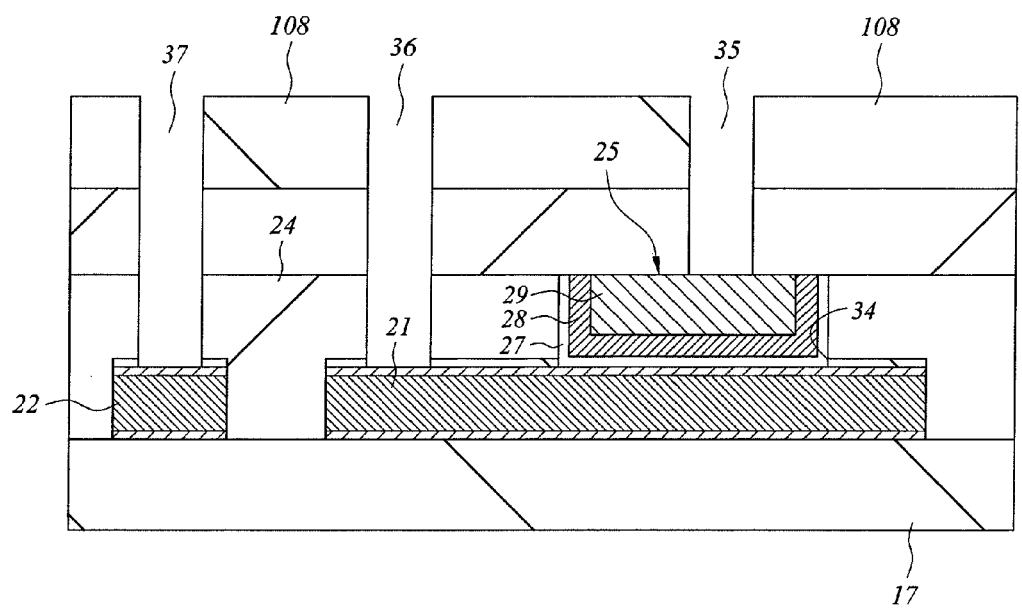
FIG. 15 is a cross-sectional view showing the method for manufacturing the semiconductor device continued from FIG. 14.

Next, as shown in FIG. 15, the third interlayer insulating film 30 on the protective metal film 29 is subjected to dry etching with using a photoresist film 108, which is formed on the third interlayer insulating film 30, as a mask, thereby forming the contact hole 35. Also, at this time, the third interlayer insulating film 30, the second interlayer insulating film and the EARL film 41 on the lower electrode 21 are subjected to dry etching, thereby forming the contact hole 36, and the third interlayer insulating film 30, the second interlayer insulating film and the BARL film 41 on the second-layer wiring 22 are subjected to dry etching, thereby forming the contact hole 37. Then, the metal plugs 38 are formed in the contact holes 35, 36 and 37. In order to form the metal plugs 38, for example, a metal film made of a tungsten film or a titanium nitride film is deposited on the third interlayer insulating film 30 and in the contact holes 35, 36 and 37 by a sputtering method or a CVD method, and subsequently, the metal film on the third interlayer insulating film 30 is polished and removed by a CMP method.

Figure 16:
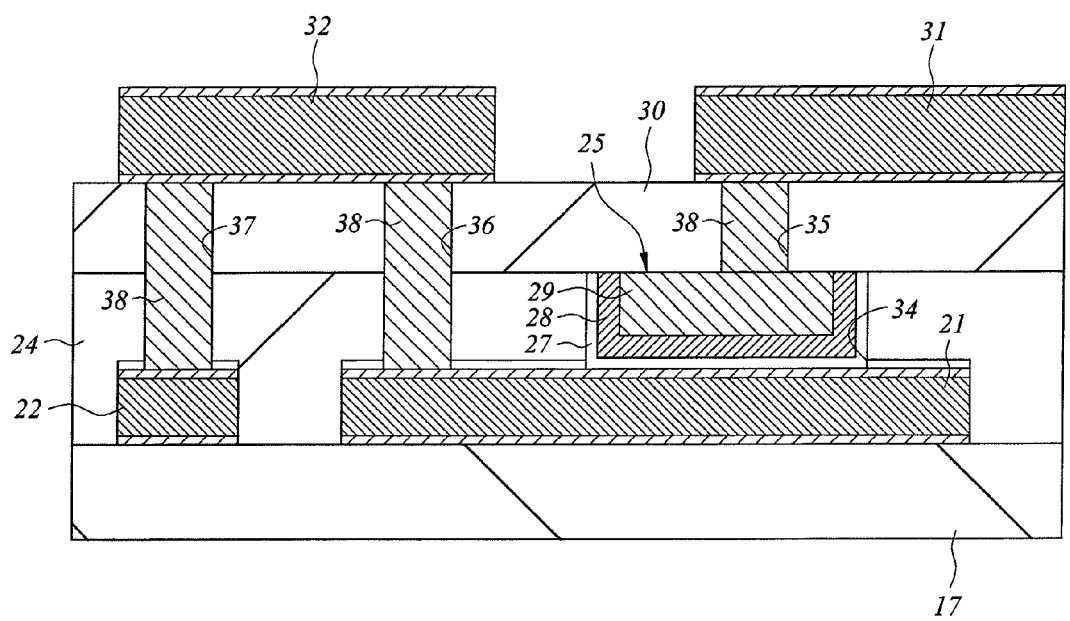
FIG. 16 is a cross-sectional view showing the method for manufacturing the semiconductor device continued from FIG. 15.

Next, as shown in FIG. 16, the third-layer wirings 31 and 32 are formed on the third interlayer insulating film 30. The material and the forming method of the third-layer wirings 31 and 32 may be the same as those of the lower electrode 21 and the second-layer wiring 22. Since the surface of the third interlayer insulating film 30 is sufficiently flat, it is free from irregularities, which cause problems when fine etching is carried out. Therefore, the wiring density of the third-layer wirings 31 and 32 can be increased. Through the steps described above, the semiconductor device shown in FIG. 1 is completed.

Figure 17A:
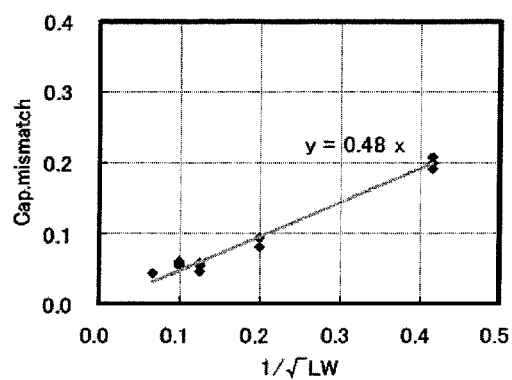
FIG. 17A is a graph showing the mismatch characteristics of the capacitor of the comparative example 1.
Figure 17B:
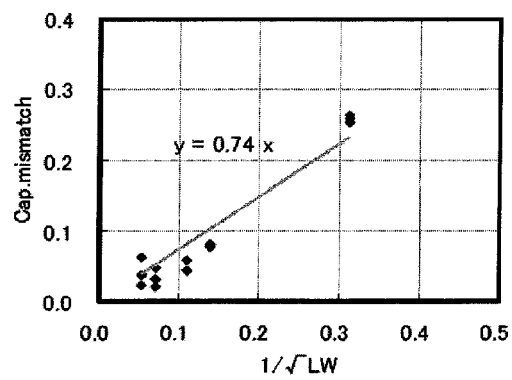
FIG. 17B is a graph showing the mismatch characteristics of the capacitor of the comparative example 2.
Figure 17C:
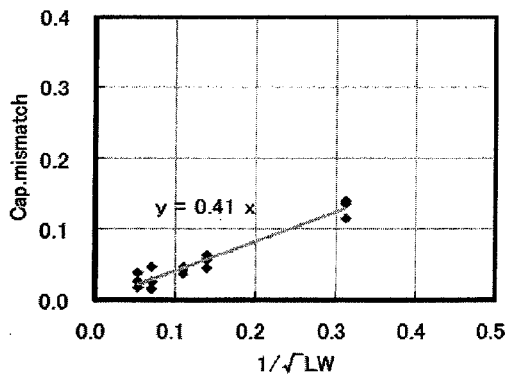
FIG. 17C is a graph showing the mismatch characteristics of the MIM capacitor of the present invention.

Next, effects of the present invention will be described. FIGS. 17A to 17C are graphs showing the mismatch characteristics of the MIM capacitor of the present invention manufactured by the above-described method, the comparative example 1 (the parallel-plate MIM capacitor described with reference to FIG. 29 and FIGS. 30A to 30D) and the comparative example 2 (the trench MIM capacitor described with reference to FIG. 31 to FIG. 33C). The graph of FIG. 17A shows the mismatch coefficients of the comparative example 1, the graph of FIG. 17B shows the mismatch coefficients of the comparative example 2, and the graph of FIG. 17C shows the mismatch coefficients of the MIM capacitor of the present invention.

In each of the graphs of FIGS. 17A, 17B and 17C, the horizontal axis represents the reciprocal of the square root of the designed area of the MIM capacitor, and the vertical axis plots the value (capacitance mismatch) obtained by dividing the difference in the electrostatic capacitances of adjacent MIM capacitors by the average value thereof. Specifically, the capacitance mismatch becomes smaller as the variations of the adjacent MIM capacitors are reduced. The points in each of the graphs represent the plotted values obtained by measuring the capacitance mismatch in the MIM capacitors having various areas. In each of the graphs, the slope of the vertical axis (capacitance mismatch) with respect to the horizontal axis (the reciprocal of the square root of the area) is referred to as a capacitance mismatch coefficient. The capacitance mismatch coefficient is generally used as an evaluation index of the variation accuracy of capacitors, and the capacitor with the smaller capacitance mismatch coefficient means the higher-performance capacitor with smaller variations.

As shown in the graphs of FIGS. 17A, 17B and 17C, the mismatch coefficient of the comparative example 1 (the parallel-plate MIM capacitor) is 0.48, the mismatch coefficient of the comparative example 2 (the trench MIM capacitor) is 0.74, and the mismatch coefficient of the MIM capacitor according to the present invention is 0.41. The reason why the mismatch coefficient of the comparative example 2 is significantly large is that, as described above, the end part of the upper electrode is positioned on the interlayer insulating film outside the opening part due to the variations in the mask position accuracy caused by the formation using photolithography technique and dry etching technique, and the parasitic capacitance is generated between that and the wiring in the lower layer via the interlayer insulating film (see FIGS. 33A to 33C). Then, since the capacitance value of the MIM capacitor is reduced as the diameter of the trench (opening part) becomes smaller and the influence of the parasitic capacitance with respect to the capacitance value of the MIM capacitor is relatively increased, the variations in the parasitic capacitance become nonnegligible large values.

The parasitic capacitance value of the conventional trench MIM capacitor depends on the area of the manufactured MIM capacitor, in other words, the bottom area of the trench (opening part) and the processing accuracy of the upper electrode, and in the structure studied by the inventors of the present invention, it has the influence of up to about 3 to 4%.

On the other hand, in the parallel-plate MIM capacitor and the structure of the present invention in which the upper electrode and the lower electrode are not opposed to each other in the region other than the region in which the MIM capacitor is formed, the parasitic capacitance described above is not generated, and therefore, a high-accuracy MIM capacitor with small variations can be formed.

Figure 18:
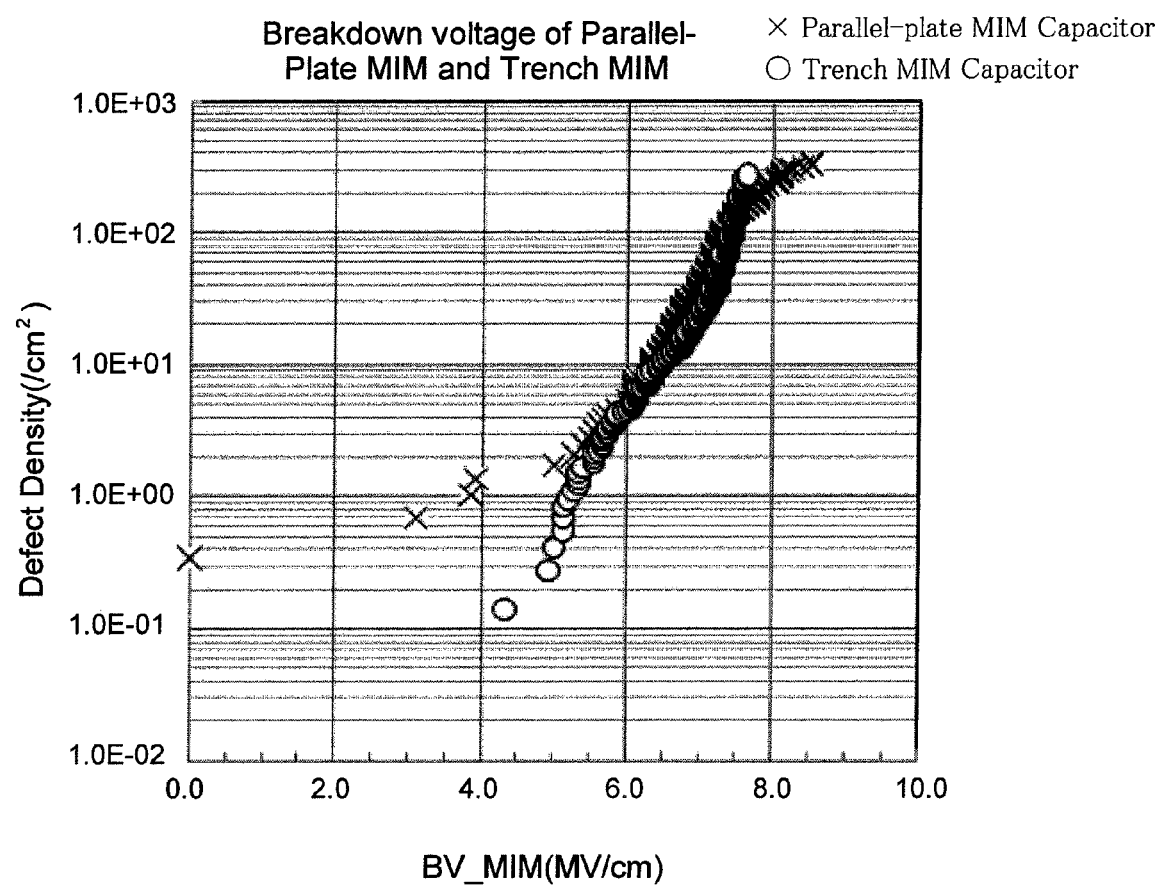
FIG. 18 is a graph plotting the insulation breakdown resistance of a parallel-plate MIM capacitor and a trench MIM capacitor.

FIG. 18 is a graph plotting the insulation breakdown resistance of the parallel-plate MIM capacitor and the trench MIM capacitor. The horizontal axis represents the electric field intensity applied to the MIM capacitor per 1 cm of the thickness of the capacitance insulating film. The vertical axis represents the cumulative value of the MIM capacitor area in which the capacitance insulating film reaches its insulation breakdown when a DC voltage is applied to the MIM capacitor. The horizontal axis is referred to as "breakdown voltage", and the vertical axis is referred to as "cumulative defect density". In other words, FIG. 18 is a drawing plotting the area of the MIM capacitor which reaches its breakdown when a voltage is applied, and the drawing shows that the element having the smaller cumulative defect density at the same breakdown voltage is the MIM capacitor having higher stability.

As shown in FIG. 18, when the breakdown voltage is 5.5 MV/cm or lower, there is a large difference in the cumulative defect density between the parallel-plate MIM capacitor and the trench MIM capacitor of the present invention. For example, when compared at a breakdown voltage of 5.0 V, the cumulative defect density of the parallel-plate MIM capacitor is 1.74/cm$^2$, while that of the trench MIM capacitor of the present invention is 0.42/cm$^2$.

Figure 29:
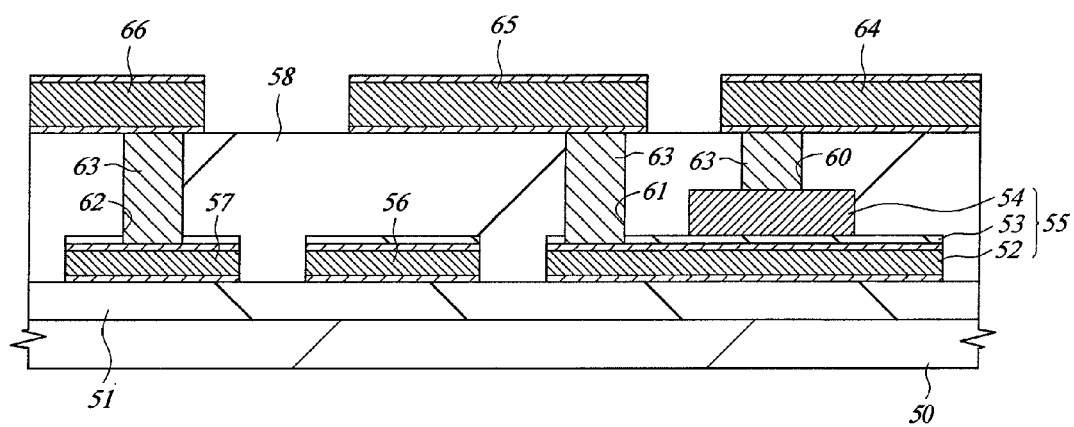
FIG. 29 is a cross-sectional view showing a conventional parallel-plate MIM capacitor studied by the inventors of the present invention.
Figure 30A:
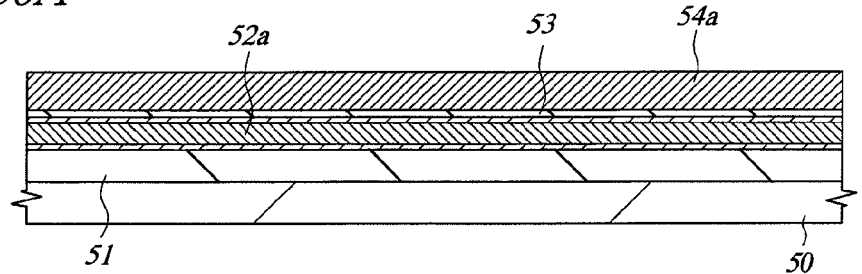
FIG. 30A is a cross-sectional view showing a method for manufacturing the conventional parallel-pate MIM capacitor studied by the inventors of the present invention.
Figure 30B:
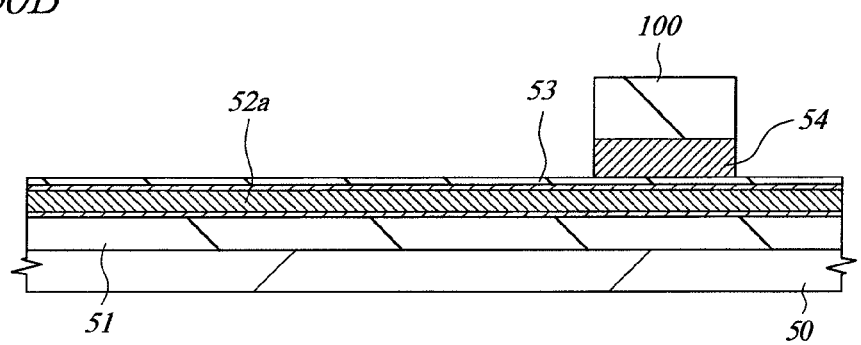
FIG. 30B is a cross-sectional view showing a method for manufacturing the conventional parallel-pate MIM capacitor studied by the inventors of the present invention.
Figure 30C:
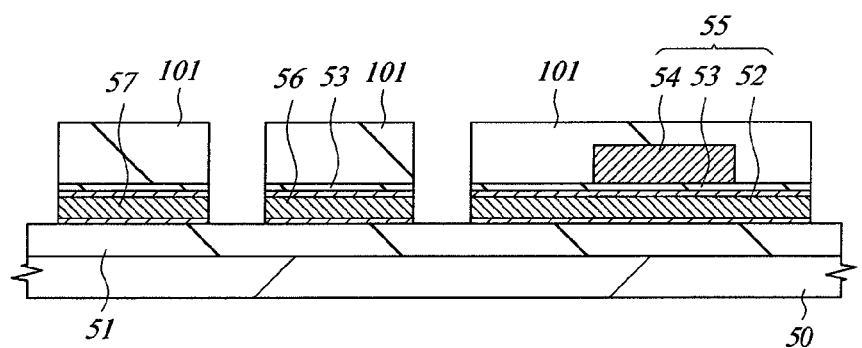
FIG. 30C is a cross-sectional view showing a method for manufacturing the conventional parallel-pate MIM capacitor studied by the inventors of the present invention.
Figure 30D:
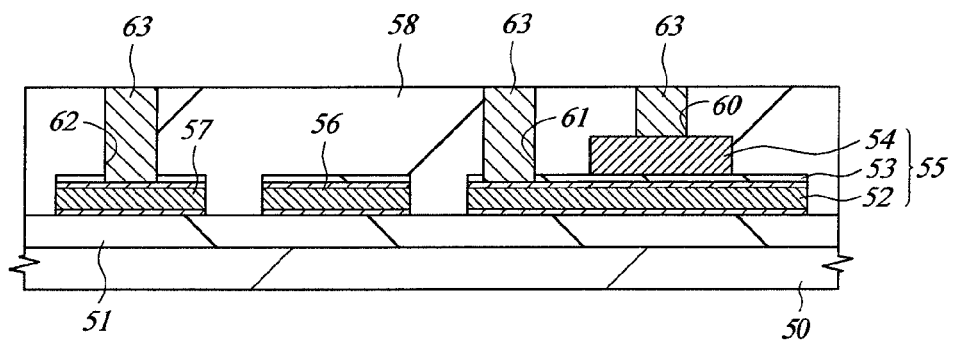
FIG. 30D is a cross-sectional view showing a method for manufacturing the conventional parallel-pate MIM capacitor studied by the inventors of the present invention.
Figure 31:
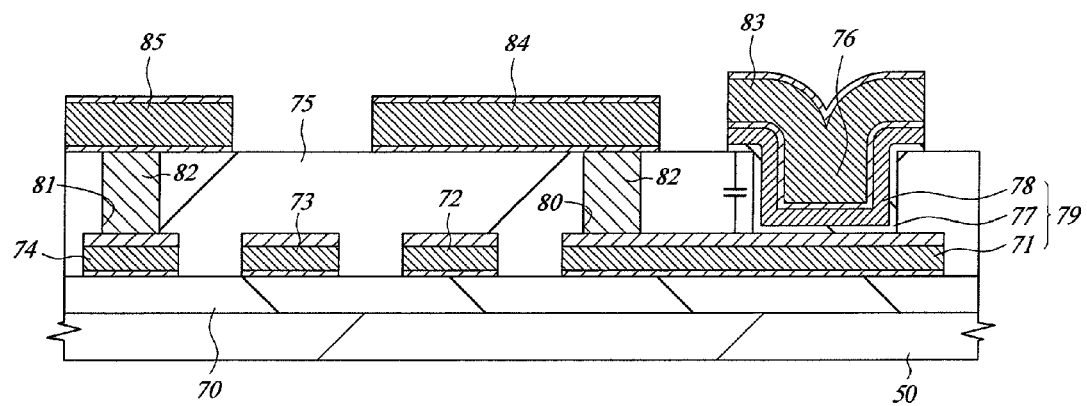
FIG. 31 is a cross-sectional view showing a conventional trench MIM capacitor studied by the inventors of the present invention.
Figure 32A:
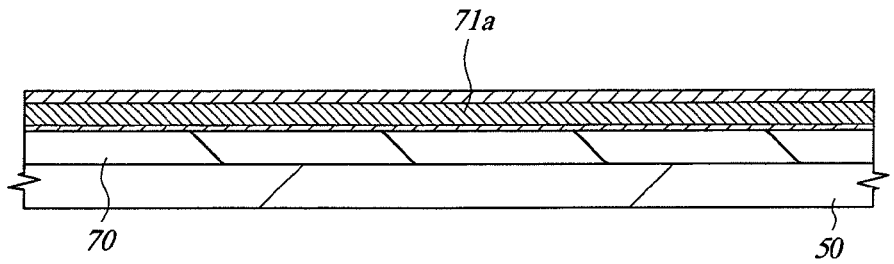
FIG. 32A is a cross-sectional view showing a method for manufacturing the conventional trench MIM capacitor studied by the inventors of the present invention.
Figure 32B:
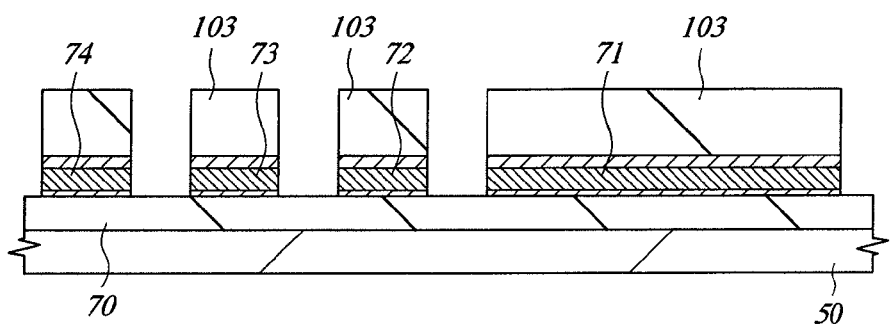
FIG. 32B is a cross-sectional view showing a method for manufacturing the conventional trench MIM capacitor studied by the inventors of the present invention.
Figure 32C:
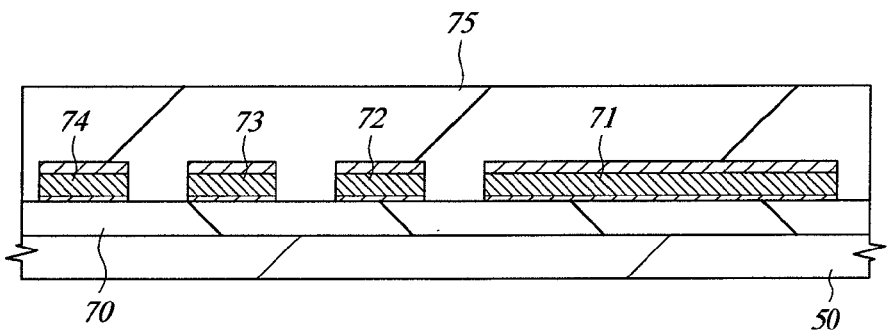
FIG. 32C is a cross-sectional view showing a method for manufacturing the conventional trench MIM capacitor studied by the inventors of the present invention.
Figure 32D:
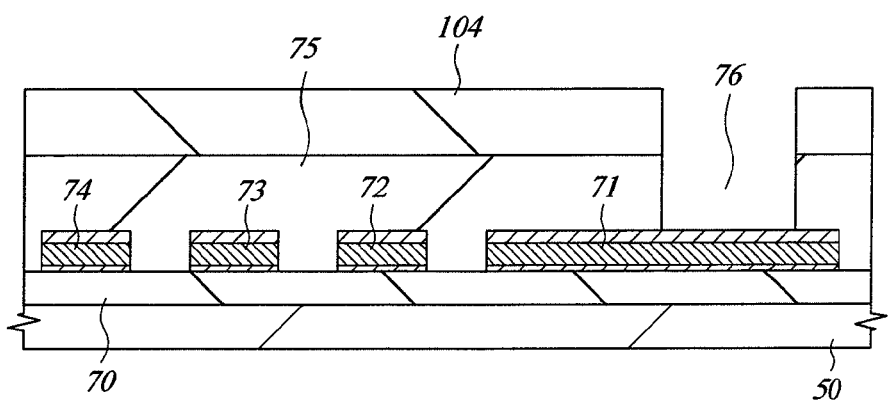
FIG. 32D is a cross-sectional view showing a method for manufacturing the conventional trench MIM capacitor studied by the inventors of the present invention.
Figure 33A:
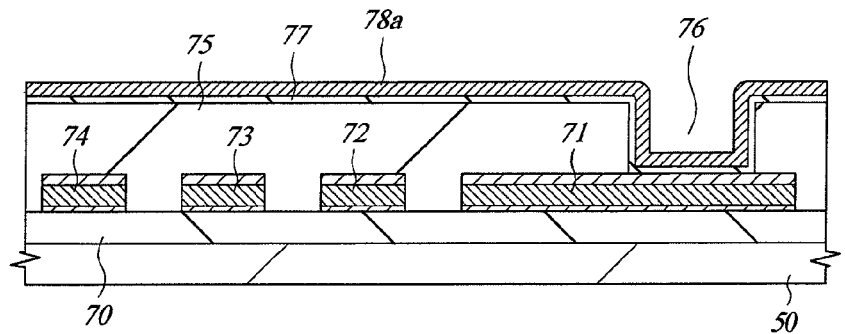
FIG. 33A is a cross-sectional view showing the method for manufacturing the trench MIM capacitor continued from FIG. 32D.
Figure 33B:
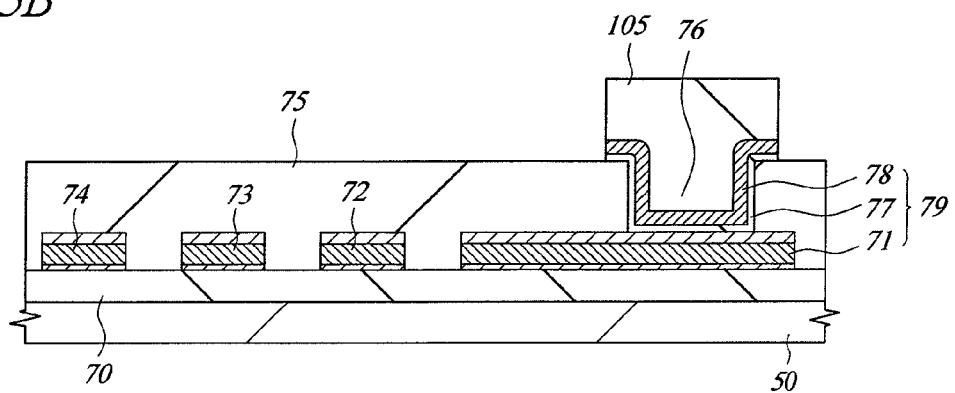
FIG. 33B is a cross-sectional view showing the method for manufacturing the trench MIM capacitor continued from FIG. 33A.
Figure 33C:
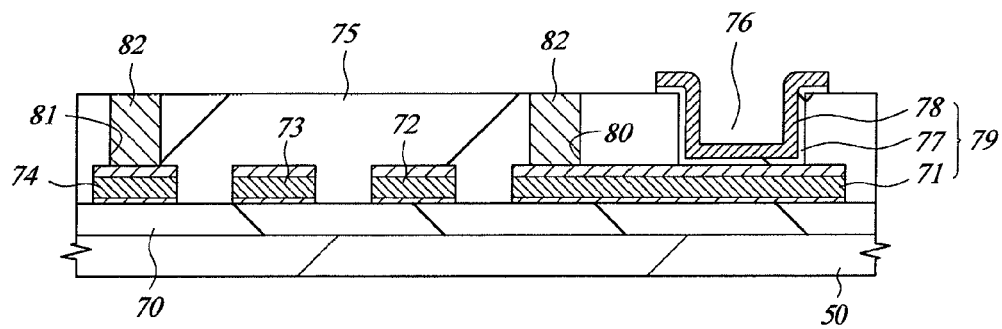
FIG. 33C is a cross-sectional view showing the method for manufacturing the trench MIM capacitor continued from FIG. 33B.

As shown in FIG. 29, in the parallel-plate MIM capacitor, only the distance corresponding to the film thickness of the capacitance insulating film 53 is ensured as the physical distance between the end part of the upper electrode 54 and the surface of the lower electrode layer 52 where electric field concentration may occur. Also, when the electrostatic capacitor 55 is covered with the interlayer insulating film 58, the end part of the upper electrode 54 and the surface of the lower electrode 52 are in contact with the same insulating film interface which is inferior in insulation properties, and this serves as a factor for the increase of the leakage current.

On the other hand, in the structure of the present invention, as shown in FIG. 4, the end part of the upper electrode 28 is not in contact with the lower electrode 21, and the distance corresponding to the level difference of the opening part 34, in other words, the height of the surface of the upper electrode 28 and the upper surface of the interlayer insulating film 24 is ensured as the physical distance therebetween. Since the distance from the electrode end part at which the insulation breakdown readily occurs is physically sufficient in this structure, it can be said that the insulation breakdown resistance is good.

The above-described two points are the effects of the capacitor structure of the present invention. Furthermore, there are the following two points as additional effects.

The capacitance insulating film of the trench MIM capacitor has small restrictions with respect to the film thickness and the film quality thereof as is clear from the manufacturing method thereof. On the other hand, the parallel-plate MIM capacitor studied by the inventors of the present invention has restrictions in the film thickness of the capacitance insulating film because of the electric field concentration at the end part of the upper electrode and the above-described restrictions in the processing of the upper electrode. Regarding this point, a capacitor having a higher electrostatic capacitance can be formed by the trench MIM capacitor.

Moreover, since the lower electrode can be formed in the step of processing the wiring of the same layer as described above, there is no need to form a particular wiring layer or the like. Therefore, the increase in the integration of LSI and the reduction in the number of wiring layers can be expected, and the manufacturing cost of LSI can be reduced.

In a semiconductor device in which an analog-digital circuit is mounted, a generally-well-known pipeline-type analog-digital converter circuit or successive-approximation type analog-digital converter circuit is mounted, and a high-capacitance and high-accuracy electrostatic capacitor is indispensable for improving the performance of such an analog-digital converter circuit. Therefore, it can be said that the capacitor structure of the present invention can be effectively applied to a capacitor mounted in such a circuit.

Second Embodiment

In the above-described first embodiment, the first metal film (for example, a stacked film of a titanium nitride film, an aluminum alloy film and a titanium nitride film) is processed at the same time to form the lower electrode 21 of the electrostatic capacitor 25 and the second-layer wiring 22. However, one of the characteristics of the present invention lies in that the formation of the electrostatic capacitor 25 does not affect the formation processes of the wiring (second-layer wiring 22) in the same layer as the lower electrode 21 and the wiring (third-layer wirings 31 and 32) in the upper layer of the lower electrode 21. Therefore, the lower electrode 21, the second-layer wiring 22 and the third-layer wirings 31 and 32 may be formed of a metal material that is different from the first metal film 40.

Figure 19:
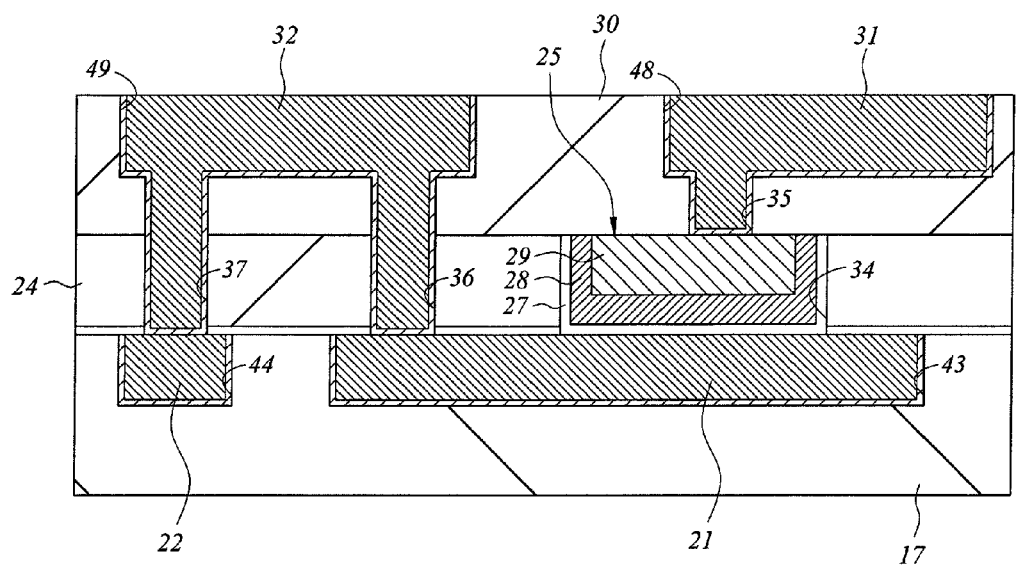
FIG. 19 is a cross-sectional view showing a main part of a semiconductor device of a second embodiment of the present invention.

FIG. 19 is a cross-sectional view in which the lower electrode 21, the second-layer wiring 22 and the third-layer wirings 31 and 32 are formed by the so-called damascene process utilizing a CMP method. Hereinafter, a method of forming the wiring by the damascene process will be described with reference to FIG. 20 to FIG. 24. Like the above-described first embodiment, in the following drawings, the illustration of the region below the first interlayer insulating film 17 is omitted, and only the first interlayer insulating film 17 and the region above the first interlayer insulating film 17 are shown.

Figure 20:
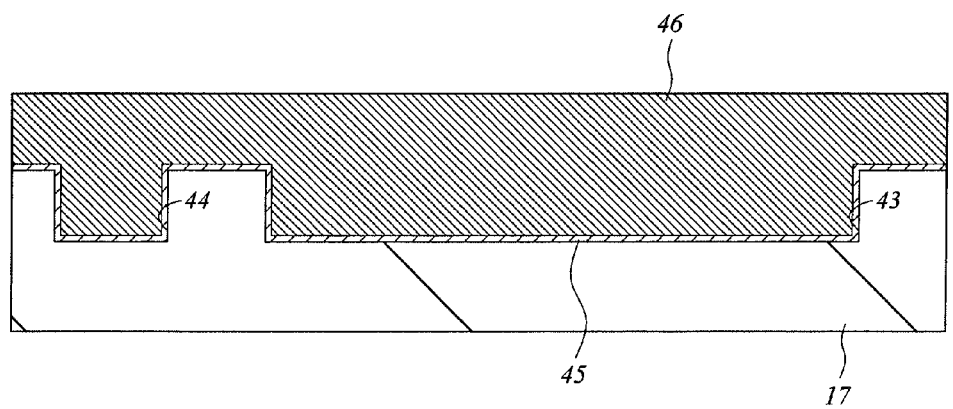
FIG. 20 is a cross-sectional view showing a method for manufacturing the semiconductor device of the second embodiment of the present invention.

First, as shown in FIG. 20, after wiring trenches 43 and 44 are formed in the first interlayer insulating film 17, a barrier metal film 45 is deposited on the first interlayer insulating film 17 and in the wiring trenches 43 and 44, and subsequently, a copper film 46 is formed on the barrier metal film 45 by using a plating method. The wiring trenches 43 and 44 are formed by performing the dry etching of the first interlayer insulating film 17 with using a photoresist film (not shown) as a mask. The barrier metal film 45 is made of, for example, a tantalum nitride film deposited by a sputtering method. The copper film 46 is formed so as to have a large film thickness by which the interiors of the wiring trenches 43 and 44 are completely filled.

Figure 21:
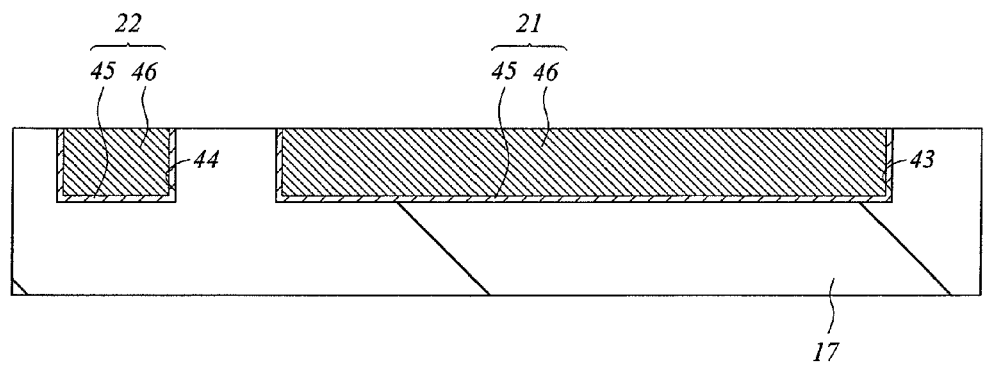
FIG. 21 is a cross-sectional view showing the method for manufacturing the semiconductor device continued from FIG. 20.

Next, as shown in FIG. 21, the copper film 46 and the barrier metal film 45 on the first interlayer insulating film 17 are polished and removed by using a CMP method, thereby causing these films to remain only in the wiring trenches 43 and 44. At this point, the upper surfaces of the copper film 46 and the barrier metal film 45 remaining in the wiring trenches 43 and 44 have the same height as the surface of the first interlayer insulating film 17. In this manner, the lower electrode 21 made of the stacked film of the barrier metal film 45 and the copper film 46 is formed in the wiring trench 43, and the second-layer wiring 22 made of the stacked film of the barrier metal film 45 and the copper film 46 is formed in the wiring trench 44.

Figure 22:
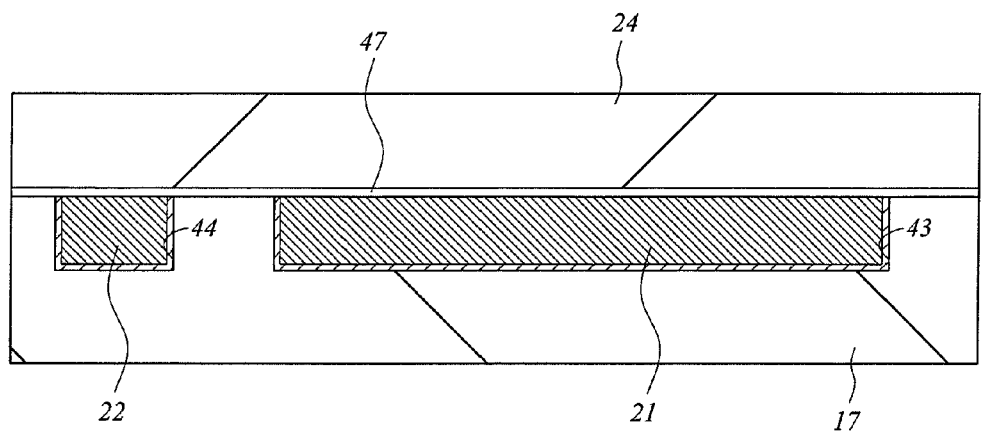
FIG. 22 is a cross-sectional view showing the method for manufacturing the semiconductor device continued from FIG. 21.

Next, as shown in FIG. 22, after a diffusion preventing film 47 is deposited on the first interlayer insulating film 17, the lower electrode 21 and the second-layer wiring 22, the second interlayer insulating film 24 is deposited on the diffusion preventing film 47. The diffusion preventing film 47 is an insulating film which prevents the copper components constituting each part of the lower electrode 21 and the second-layer wiring 22 from being diffused into the second interlayer insulating film 24 and is made of, for example, a silicon nitride film or an oxygen-added silicon carbide film deposited by a CVD method. The second interlayer insulating film 24 is made of, for example, a silicon oxide film or a carbon-added silicon oxide film deposited by a CVD method. Since the second interlayer insulating film 24 is deposited on the flat first interlayer insulating film 17, the surface thereof becomes flat even when the surface is not subjected to CMP.

Figure 23:
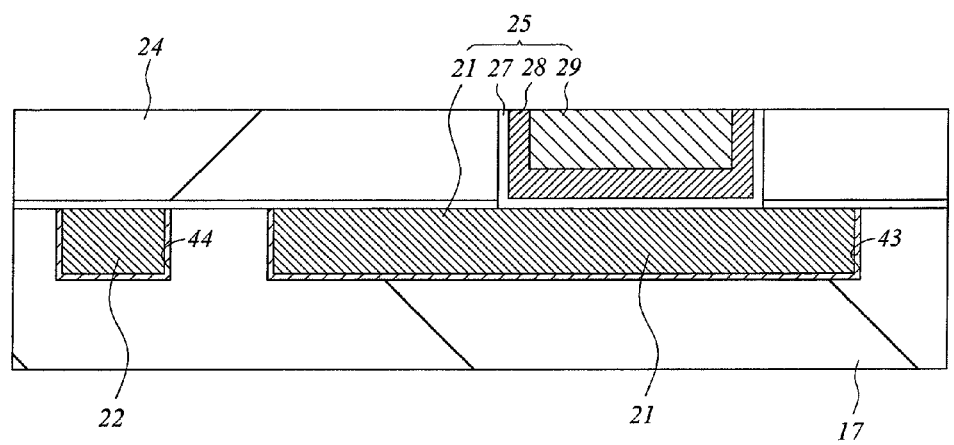
FIG. 23 is a cross-sectional view showing the method for manufacturing the semiconductor device continued from FIG. 22.

Next, as shown in FIG. 23, after the opening part 34 is formed in the second interlayer insulating film 24 and the diffusion preventing film 47 on the lower electrode 21, the electrostatic capacitor 25 with the MIM structure made up of the capacitance insulating film 27, the upper electrode 28 and the protective metal film 29 is formed in the opening part 34. The method for forming the opening part 34 and the method for forming the electrostatic capacitor 25 may be the same as those described in the first embodiment (see FIG. 10 to FIG.

13). As the capacitance insulating film 27 of the electrostatic capacitor 25, the material shown as an example in the above-described first embodiment is used, but the material capable of preventing diffusion of the copper component in the lower electrode 21 is desirable. As the upper electrode 28 and the protective metal 29, the materials shown as examples in the above-described first embodiment are used.

Figure 24:
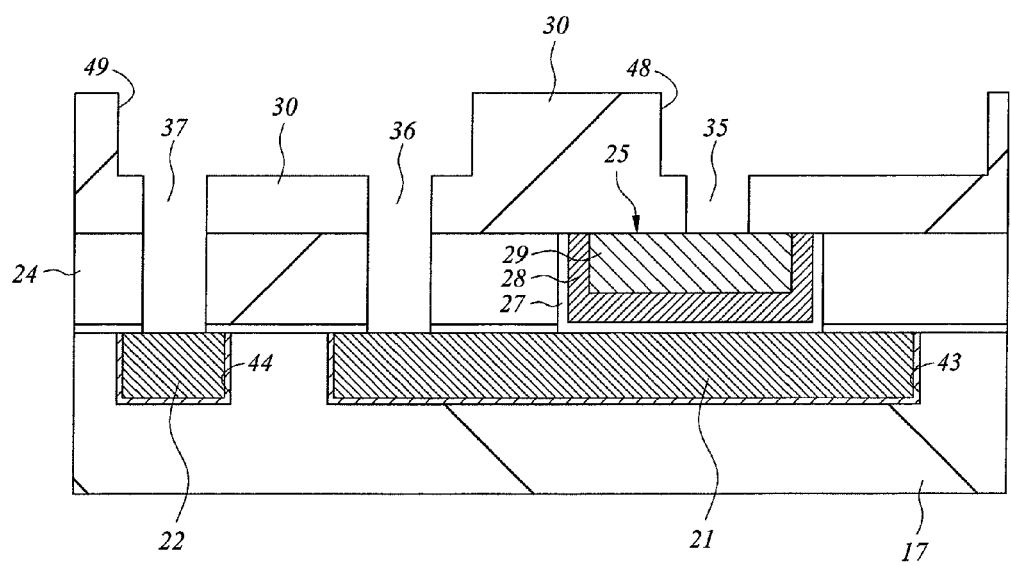
FIG. 24 is a cross-sectional view showing the method for manufacturing the semiconductor device continued from FIG. 23.

Next, as shown in FIG. 24, after the third interlayer insulating film 30 is deposited on the second interlayer insulating film 24 and the electrostatic capacitor 25, wiring trenches 48 and 49 are formed in the third interlayer insulating film 30. Moreover, the contact hole 35 is formed in the third interlayer insulating film 30 below the wiring trench 48, and the contact holes 36 and 37 are formed in the third interlayer insulating film 30, the second interlayer insulating film 24 and the diffusion preventing film 47 below the wiring trench 49. The wiring trenches 48 and 49 and the contact holes 35, 36 and 37 are formed by the dry etching using photoresist films (not shown) as masks. Either the wiring trenches 48 and 49 or the contact holes 35, 36 and 37 may be formed first. When the protective metal film 29 of the electrostatic capacitor 25 is made of copper, a diffusion preventing film having the same composition as the diffusion preventing film 47 is deposited in the layer below the third interlayer insulating film 30 in order to prevent copper components from being diffused into the third interlayer insulating film 30.

Then, the third-layer wirings 31 and 32 are buried in the wiring trenches 48 and 49 and the contact holes 35, 36 and 37 by the damascene process, thereby completing the wiring structure shown in FIG. 19. The material and the forming method of the third-layer wirings 31 and 32 may be the same as those of the above-described lower electrode 21 and the second-layer wiring 22.

Third Embodiment

In the above-described first and second embodiments, the capacitance insulating film 27, the upper electrode 28 and the protective metal film 29 of the electrostatic capacitor 25 are buried in the opening part 34. However, in the present embodiment, a process for causing a part of the capacitance insulating film 27 to remain outside the opening part 34 (on the surface of the second interlayer insulating film 24) will be described.

Figure 25:
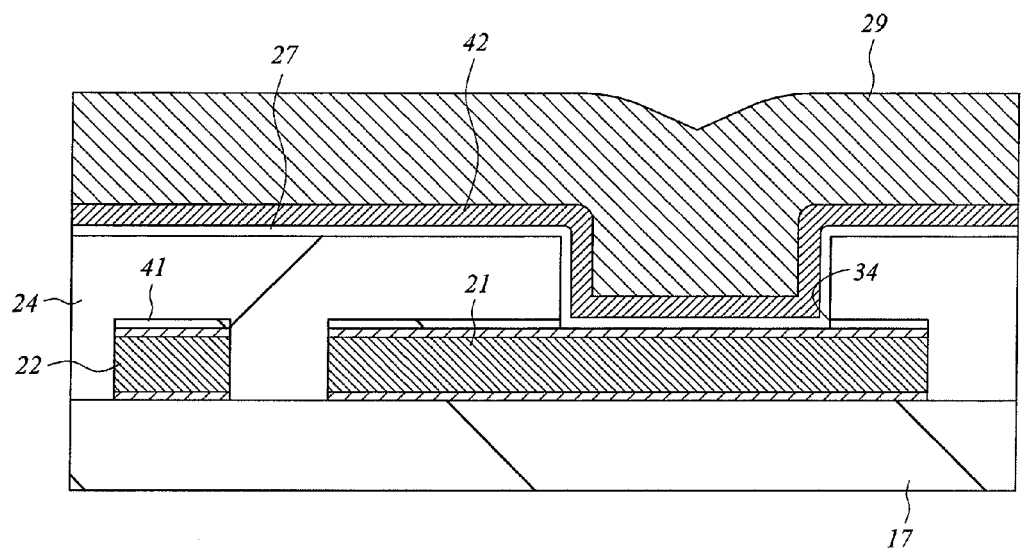
FIG. 25 is a cross-sectional view showing a method for manufacturing a semiconductor device of a third embodiment of the present invention.

First, as shown in FIG. 25, the opening part 34 is formed in the second interlayer insulating film 24 on the lower electrode 21, and then, the capacitance insulating film 27 is deposited so as to cover the upper part of the second interlayer insulating film 24 and the bottom surface and the side surface of the opening part 34. Subsequently, after the second metal film 42 for the upper electrode is deposited on the capacitance insulating film 27, the protective metal film 29 is deposited on the second metal film 42. The steps above are the same as those shown in FIG. 5 to FIG. 12 of the above-described first embodiment.

Figure 26:
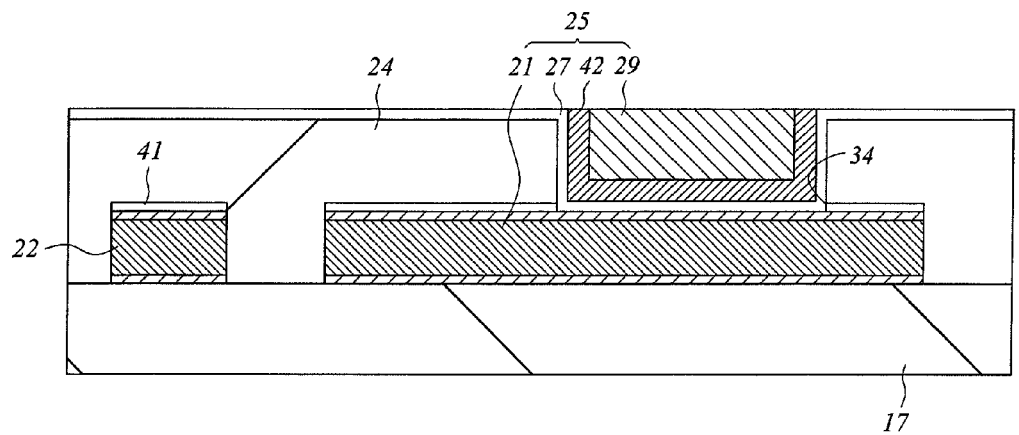
FIG. 26 is a cross-sectional view showing the method for manufacturing the semiconductor device continued from FIG. 25.

Next, as shown in FIG. 26, the protective metal film 29 and the second metal film 42 on the second interlayer insulating film 24 are polished and removed by using a CMP method. In this CMP, polishing is stopped at the point when the second metal film 42 on the second interlayer insulating film 24 is polished and removed to cause the capacitance insulating film 27 to remain on the second interlayer insulating film 24. Through the steps described above, the capacitance insulating film 27, the upper electrode 28 (second metal film 42) and the protective metal film 29 are buried in the opening part 34, and the electrostatic capacitor 25 with the MIM structure is completed.

In the above-described method for forming the capacitor 25, the capacitance insulating film 27 remains on the surface of the second interlayer insulating film 24. However, since the protective metal film 29 and the second metal film 42 on the surface of the second interlayer insulating film 24 are removed, the problem of the parasitic capacitance caused in the above-described trench MIM capacitor structure of the Patent Document 1 does not occur. Therefore, the subsequent steps (the steps after FIG. 14 of the above-described first embodiment) may be carried out in the state in which the capacitance insulating film 27 remains on the surface of the second interlayer insulating film 24.

However, when the capacitance insulating film 27 remains on the surface of the second interlayer insulating film 24, the subsequent etching of the second interlayer insulating film 24 in the step of forming the contact holes 36 and 37 (see FIG. 15) becomes cumbersome. Moreover, when the capacitance insulating film 27 having a high dielectric constant remains on the surface of the second interlayer insulating film 24, the parasitic capacitance between the second-layer wiring 22 and the third-layer wiring 32 is increased.

Figure 27:
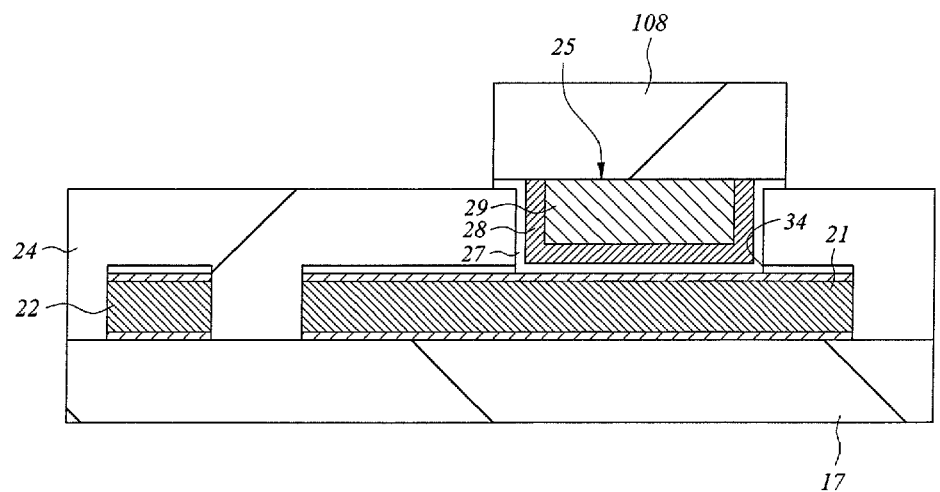
FIG. 27 is a cross-sectional view showing the method for manufacturing the semiconductor device continued from FIG. 26.

Therefore, when such a problem is conceivable, it is preferable to carry out the subsequent steps after removing the capacitance insulating film 27 on the second interlayer insulating film 24 by the dry etching using the photoresist film 108 as a mask as shown in FIG. 27. In this case, however, since the capacitance insulating film 27 on the second interlayer insulating film 24 is removed by using photolithography technique, the diameter of the photoresist film 108 has to be larger than the diameter of the opening part 34 in consideration of the misalignment between the photoresist film 108 and the opening part 34. Therefore, although the capacitance insulating film 27 slightly remains on the second interlayer insulating film 24 around the opening part 34, the formation of the contact holes 36 and 37 does not become cumbersome. Also, the increase in the parasitic capacitance between the second-layer wiring 22 and the third-layer wiring 32 is extremely small.

Figure 28:
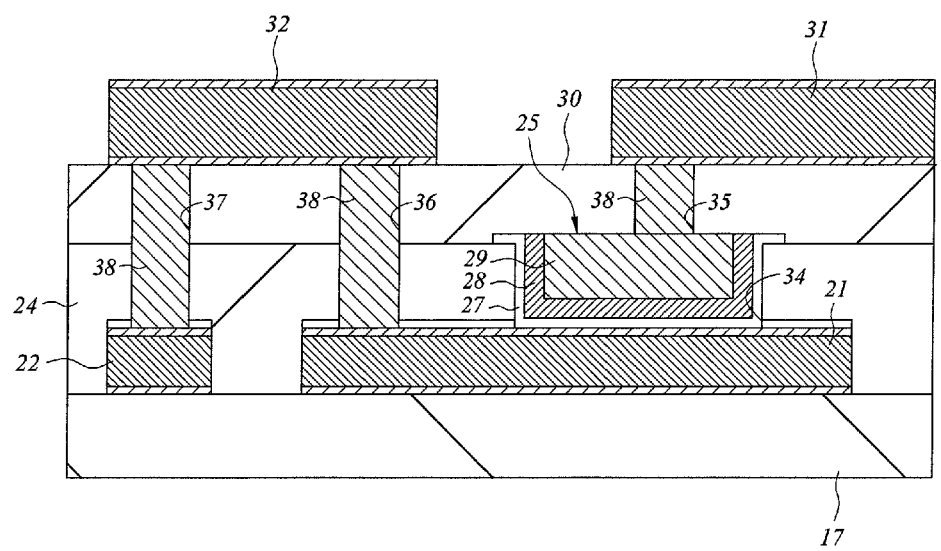
FIG. 28 is a cross-sectional view showing the method for manufacturing the semiconductor device continued from FIG. 27.

Thereafter, as shown in FIG. 28, the third interlayer insulating film 30, the contact holes 35, 36 and 37 and the metal plugs 38 are formed by the same method as the above-described first embodiment, and then, the third-layer wirings 31 and 32 are formed on the third interlayer insulating film 30.

In the above-described capacitor structure, the capacitance insulating film 27 remaining on the surface of the second interlayer insulating film 24 is present only in the vicinity of the opening part 34, and therefore, a large parasitic capacitance is not generated and the characteristic of the present invention that the parasitic capacitance can be reduced is maintained.

In recent years, development of a MIM capacitor having a higher capacitance has been desired. When a material having a high dielectric constant such as a hafnium oxide or a tantalum oxide is used as a capacitance insulating film material, it is difficult to polish and remove the capacitance insulating film together with the upper electrode material (second metal film 42) and the protective metal film 29, and therefore, the capacitance insulating film remains on the interlayer insulating film 24 in some cases.

In this case, when the contact holes 35 to 37 are formed in the layer on the capacitor 25, the stacked film made up of the third interlayer insulating film 30, the capacitance insulating film 27 and the second interlayer insulating film 24 has to be processed in order to expose the second-layer wiring 22 and the lower electrode 21. Also, as the interlayer insulating film formed between the upper and lower wiring layers, a material having a low dielectric constant is selected in general in order to reduce the parasitic capacitance between the wiring layers. On the other hand, in order to achieve the capacitance increase of the MIM capacitor, it is desirable to select an interlayer insulating film having a high dielectric constant. Therefore, in many cases, different insulating materials are stacked in the stacked film made up of the upper interlayer insulating film, the capacitance insulating film and the lower interlayer insulating film. Accordingly, in the step of forming the contact holes 35 to 37 by using dry etching technique, a method for changing the gas or the like used in dry etching during the process and a method capable of dry-etching different films at the same time have to be used, and processing becomes extremely cumbersome.

The above-described capacitor structure of the present embodiment has the effect of solving such problems. Also, in order to reduce the parasitic capacitance between the upper and lower wiring layers, the reduction of the dielectric constant of the interlayer insulating film provided between the wiring layers is effective. In the above-described capacitor structure, since the capacitance insulating film 27 on the surface of the second interlayer insulating film 24 remains only in the vicinity of the opening part 34, the effect of reducing the parasitic capacitance between the wiring layers can also be obtained. In the case of the above-described first embodiment, in order to obtain the effect, when the protective metal film 29, the second metal film 42 for the upper electrode and the capacitance insulating film 27 are to be polished by using a CMP method, the capacitance insulating film 27 which can be polished at the same time as the protective metal film 29 and the second metal film 42 has to be selected. Therefore, the degree of freedom in the material selection of the capacitance insulating film 27 is narrowed. Accordingly, the above-described capacitor structure of the present embodiment also has the effect of solving such a problem.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be applied to a semiconductor device which requires a high-capacitance and high-accuracy MIM electrostatic capacitor such as analog-digital LSI.

What is claimed is:

1. A method for manufacturing a semiconductor device having an electrostatic capacitor with a MIM structure including a lower electrode, a capacitance insulating film and an upper electrode formed on a semiconductor substrate,
    wherein a step of forming the electrostatic capacitor includes:
    (a) a step of patterning a first metal film formed on a first interlayer insulating film on the semiconductor substrate, thereby forming the lower electrode;
    (b) a step of forming a second interlayer insulating film on the first interlayer insulating film and the lower electrode;
    (c) a step of forming an opening part in a part of the second interlayer insulating film, thereby causing a surface of the lower electrode to be exposed from a bottom surface of the opening part;
    (d) a step of forming the capacitance insulating film so as to cover an upper part of the second interlayer insulating film and a side wall and the bottom surface of the opening part;
    (e) a step of sequentially forming a second metal film and a protective metal film on the capacitance insulating film, thereby filling the opening part with the protective metal film;
    (f) a step of polishing and removing the protective metal film and the second metal film on the second interlayer insulating film by a chemical mechanical polishing method, thereby causing the capacitance insulating film, the upper electrode made of the second metal film and the protective metal film to remain in the opening part and causing the capacitance insulating film to remain on the second interlayer insulating film; and
    (g) a step of forming a third interlayer insulating film on the second interlayer insulating film.

2. The method for manufacturing the semiconductor device according to claim 1,
    wherein the step (a) further includes a step of patterning the first metal film, thereby forming lower-layer wiring on the first interlayer insulating film.

3. The method for manufacturing the semiconductor device according to claim 1, further comprising:
    a step of etching the capacitance insulating film remaining on the second interlayer insulating film with using a photoresist film covering an upper part of the opening part as a mask.

4. The method for manufacturing the semiconductor device according to claim 1,
    wherein the step (a) includes:
    (a-1) a step of forming a wiring trench in a part of the first interlayer insulating film;
    (a-2) a step of depositing the first metal film on the first interlayer insulating film and in the wiring trench, thereby filling an interior of the wiring trench with the first metal film; and
    (a-3) a step of polishing and removing the first metal film on the first interlayer insulating film by a chemical mechanical polishing method, thereby forming the lower electrode having the first metal film in the wiring trench.

5. The method for manufacturing the semiconductor device according to claim 4,
    wherein the first metal film includes a metal film containing copper, and
    the method further includes a step of forming an insulating film for preventing diffusion of the copper on the first interlayer insulating film after the step (a-3).

6. The method for manufacturing the semiconductor device according to claim 1, further comprising:
    after the step (g),
    (h) a step of forming a first contact hole in the third interlayer insulating film and forming a metal plug in the first contact hole; and
    (i) a step of forming first upper-layer wiring on the third interlayer insulating film and electrically connecting the first upper-layer wiring and the protective metal film in the opening part via the metal plug in the first contact hole.

7. The method for manufacturing the semiconductor device according to claim 6,
    wherein the step (h) further includes a step of forming a second contact hole in the third interlayer insulating film and the second interlayer insulating film and forming a metal plug in the second contact hole, and
    the step (i) further includes a step of forming second upper-layer wiring on the third interlayer insulating film and electrically connecting the second upper-layer wiring and the lower electrode via the metal plug in the second contact hole.

* * * * *